(12) United States Patent
Sakai et al.

(10) Patent No.: US 11,362,207 B2
(45) Date of Patent: Jun. 14, 2022

(54) SEMICONDUCTOR DEVICE

(71) Applicant: RENESAS ELECTRONICS CORPORATION, Tokyo (JP)

(72) Inventors: Atsushi Sakai, Tokyo (JP); Satoru Tokuda, Tokyo (JP); Ryuuji Umemoto, Tokyo (JP); Katsumi Eikyu, Tokyo (JP); Hiroshi Yanagigawa, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 70 days.

(21) Appl. No.: 17/095,241

(22) Filed: Nov. 11, 2020

(65) Prior Publication Data
US 2021/0159331 A1    May 27, 2021

(30) Foreign Application Priority Data
Nov. 22, 2019    (JP) .............................. JP2019-211037

(51) Int. Cl.
| | |
|---|---|
| H01L 29/78 | (2006.01) |
| H01L 29/423 | (2006.01) |
| H01L 29/10 | (2006.01) |
| H01L 29/06 | (2006.01) |

(52) U.S. Cl.
CPC ...... *H01L 29/7813* (2013.01); *H01L 29/0619* (2013.01); *H01L 29/0696* (2013.01); *H01L 29/1095* (2013.01); *H01L 29/4236* (2013.01)

(58) Field of Classification Search
CPC ............. H01L 29/7813; H01L 29/0619; H01L 29/0696; H01L 29/1095; H01L 29/4236
USPC ........................................................ 257/330
See application file for complete search history.

(56) References Cited

U.S. PATENT DOCUMENTS

| | | | |
|---|---|---|---|
| 9,923,091 B2 | 3/2018 | Kudou et al. | |
| 10,727,331 B2* | 7/2020 | Ouvrard | H01L 29/0615 |
| 2009/0215239 A1* | 8/2009 | Nakazawa | H01L 29/7813 |
| | | | 438/270 |
| 2016/0035882 A1* | 2/2016 | Vielemeyer | H01L 29/7803 |
| | | | 257/330 |
| 2018/0358433 A1* | 12/2018 | Su | H01L 29/0623 |

(Continued)

FOREIGN PATENT DOCUMENTS

JP    2017-168501 A    9/2017

*Primary Examiner* — Igwe U Anya
(74) *Attorney, Agent, or Firm* — McDermott Will & Emery LLP

(57) ABSTRACT

A semiconductor device according to an embodiment comprises: a cell portion in which a vertical type MOSFET is formed; and a termination portion arranged adjacent to the cell portion. The termination portion includes a connection trench gate provided along a first direction. The cell portion includes: a plurality of first column regions provided along a second direction intersecting the first direction; and a plurality of trench gates provided along the second direction such that two trench gates are arranged between the two adjacent first column regions. The plurality of trench gates extend from the cell portion to the termination portion and are connected to the connection trench gate. The plurality of first column regions extend from the cell portion to the termination portion, and the termination portion includes a plurality of second column regions different from the plurality of first column regions.

17 Claims, 38 Drawing Sheets

(56) References Cited

U.S. PATENT DOCUMENTS

2019/0006513 A1\* 1/2019 Ouvrard ................ H01L 29/407
2021/0083061 A1\* 3/2021 Darwish ............. H01L 29/0878

\* cited by examiner

SEMICONDUCTOR DEVICE

CROSS-REFERENCE TO RELATED APPLICATION

The disclosure of Japanese Patent Application No. 2019-211037 filed on Nov. 22, 2019 including the specification, drawings and abstract is incorporated herein by reference in its entirety.

TECHNICAL FIELD OF THE INVENTION

This disclosure relates to a semiconductor device and a semiconductor device including a vertical type MOSFET (Vertical type Metal Oxide Field Effect Transistor) having a trench gate, and particularly relates to a technology suitably applied to a semiconductor device including a so-called super junction structure (hereinafter, referred to as SJ structure) having a p type column region formed so as to protrude from a bottom portion of a p type base region toward an n type drift region.

BACKGROUND OF THE INVENTION

A semiconductor device having the SJ structure includes, for example, a semiconductor substrate having an n type drift region, a p type base region formed on a surface of the n type drift region, a plurality of p type column regions connected to the p type base region and arranged in the n type drift region at predetermined intervals, agate electrode arranged between adjacent p type column regions and formed in a trench reaching a bottom surface of the p type base region, and an n type source region formed in the p type base region and formed on a side of the gate electrode.

Japanese Unexamined Patent Application Publication No. 2017-168501 (Patent Document 1) describes an example of the semiconductor device having the SJ structure. This document discloses a vertical type MOSFET including a plurality of p type column regions formed in stripe shape and stripe-shaped gate electrodes arranged between the adjacent p type column regions and formed along the p type column regions.

THERE ARE DISCLOSED TECHNIQUES LISTED BELOW

[Patent Document 1] Japanese Unexamined Patent Application Publication No. 2017-168501

SUMMARY OF THE INVENTION

The technology described below is not a well-known technology, but is the technology studied by the inventors of this application.

The vertical type MOSFET having the SJ structure is a power semiconductor device configured to control high voltage and large current, and it desirably has low on-resistance and high withstand voltage. The inventors of this application have found the configuration in which two or two or more trench gates are provided between two adjacent p type column regions, as the technology for reducing the on-resistance in the vertical type MOSFET having the SJ structure. The inventors have found that, in the case of this configuration, the withstand voltage in the termination portion where the cell region terminates is lowered as compared with the withstand voltage in the cell region where the vertical type MOSFET is formed.

An object of this disclosure is to provide the technology capable of improving the withstand voltage in the termination region.

The other object and novel feature will become apparent from the description of this specification and attached drawings.

A summary of a typical example in this disclosure will be simply described as follows.

A semiconductor device according to an embodiment comprises:
a cell portion in which a vertical type MOSFET is formed; and
a termination portion arranged adjacent to the cell portion,
wherein the termination portion includes a connection trench gate provided along a first direction,
the cell portion includes:
a plurality of first column regions provided along a second direction intersecting the first direction; and
a plurality of trench gates provided along the second direction such that two trench gates are arranged between the two adjacent first column regions,
the plurality of trench gates extend from the cell portion to the termination portion and are connected to the connection trench gate,
the plurality of first column regions extend from the cell portion to the termination portion, and
the termination portion includes a plurality of second column regions different from the plurality of first column regions.

Also, a semiconductor device according to another embodiment comprises:
a cell portion in which a vertical type MOSFET is formed; and
a termination portion arranged adjacent to the cell portion,
wherein the termination portion includes a plurality of connection trench gates provided along a first direction,
the cell portion includes:
a plurality of first column regions provided along a second direction intersecting the first direction; and
a plurality of trench gates provided along the second direction such that two trench gates are arranged between the two adjacent first column regions,
the plurality of trench gates extend from the cell portion to the termination portion and the two trench gates arranged between the two adjacent first column regions are connected to one connection trench gate,
the plurality of first column regions extend from the cell portion to the termination portion, and
the one connection trench gate is arranged between end portions of the two adjacent first column regions in the termination portion.

By the semiconductor device according to the embodiment described above, it is possible to improve the withstand voltage in the termination portion while reducing the on-resistance in the vertical type MOSFET having the SJ structure.

BRIEF DESCRIPTIONS OF THE DRAWINGS

DESCRIPTIONS OF THE PREFERRED EMBODIMENTS

Hereinafter, the embodiment and the examples will be described with reference to drawings. Note that the same components are denoted by the same reference signs in the following description, and the repetitive description thereof is omitted in some cases. Further, the drawings may be schematically shown in some cases as compared with the actual aspect in order to make the description clearer, but this is just for example and does not limit the interpretation of the present invention.

A semiconductor device according to the embodiment will be described below in detail with reference to drawings. Note that the same components or corresponding components are denoted by the same reference signs in the specification and the drawings, and the redundant description may be omitted in some cases. Also, each embodiment and each modification may be combined with each other at least partially as appropriate. Further, the diagonal lines indicating that the section is not hollow in the cross-sectional views may be omitted in some cases for making the drawings easy to see. If the section is hollow, the fact that the section is hollow is apparently described in the specification.

The signs "−" and "+" indicate relative concentration of the impurity of n conductivity type or p conductivity type. For example, in the case of an n type impurity, the impurity concentration becomes higher in the order of "$n^{--}$", "$n^{-}$", "n", "$n^{+}$", and "$n^{++}$".

First Embodiment

Figure 1:
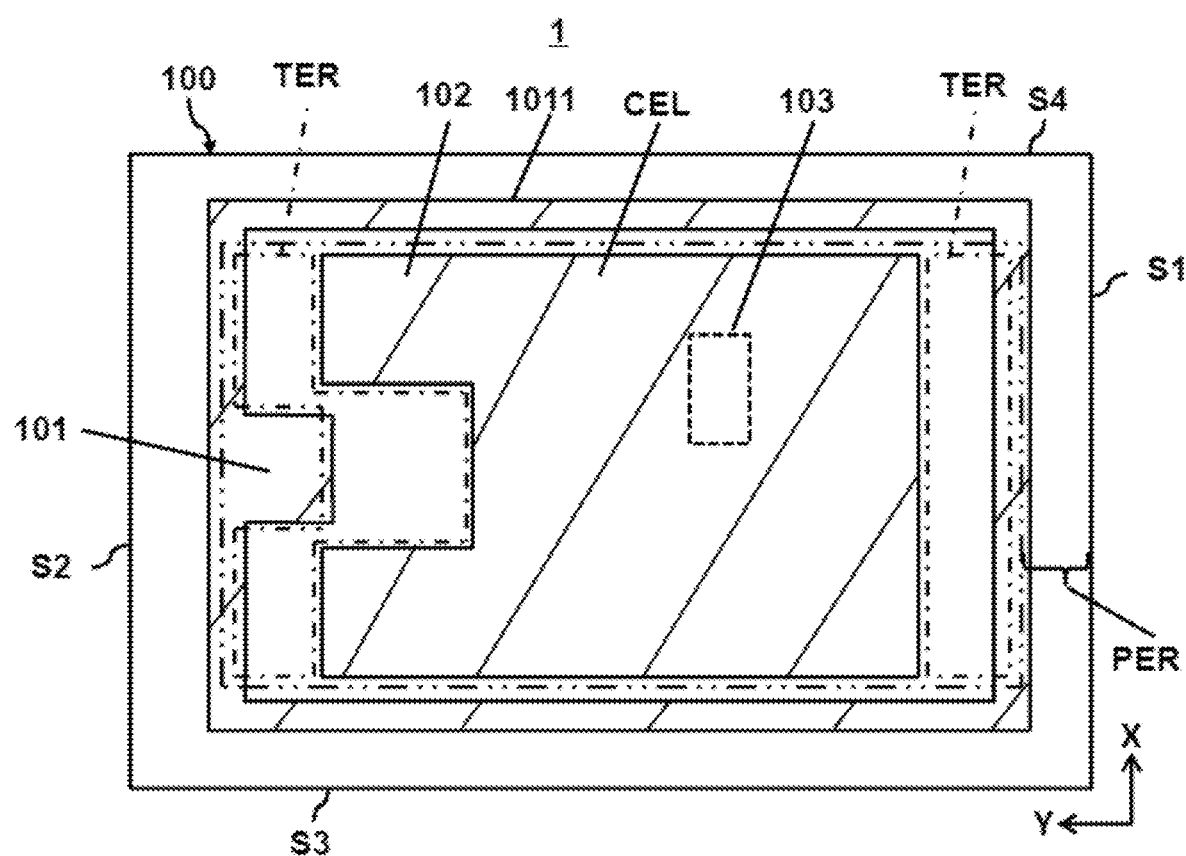
FIG. 1 is a plan view of a semiconductor device having a vertical type MOSFET structure according to the first embodiment.

A vertical type MOSFET 1 which is a semiconductor device according to this embodiment will be described with reference to FIGS. 1 to 3. FIG. 1 is a plan view of the semiconductor device having the vertical type MOSFET structure according to the first embodiment. As shown in FIG. 1, the vertical type MOSFET 1 has a gate pad 101 and a source pad 102 on a main surface of a semiconductor substrate 100. The gate pad 101 has a wiring 1011 connected to the gate pad 101 and the wiring 1011 is provided so as to surround the source pad 102. The semiconductor substrate 100 is, for example, a rectangular semiconductor chip in plan view and has a first side S1 provided along a first direction X, a second side S2 facing the first side S1, a third side S3 provided between the first side S1 and the second side S2 and provided along a second direction Y intersecting the first direction X, and a fourth side S4 facing the third side S3.

A cell region CEL is provided on the main surface of the semiconductor substrate 100 located under a lower surface of the source pad 102. The vertical type MOSFET is formed in the cell region CEL. A plurality of termination portions TER are provided on the main surface of the semiconductor substrate 100 on the left and right sides of the cell region CEL. The plurality of termination portions TER are provided so as to be adjacent to the cell region CEL between the cell region CEL and the first side S1 and between the cell region CEL and the second side S2. The termination portion TER is a region where the vertical type MOSFET is not formed, and can be referred to also as a termination region.

Also, a peripheral portion PER is provided on the main surface of the semiconductor substrate 100 so as to surround the cell region CEL and the plurality of termination portions TER. The peripheral portion PER is provided between the first to fourth sides S1 to S4 and the cell region CEL and the plurality of termination portions TER. The peripheral portion PER can be referred to also as a peripheral region or a chip peripheral region.

Figure 2:
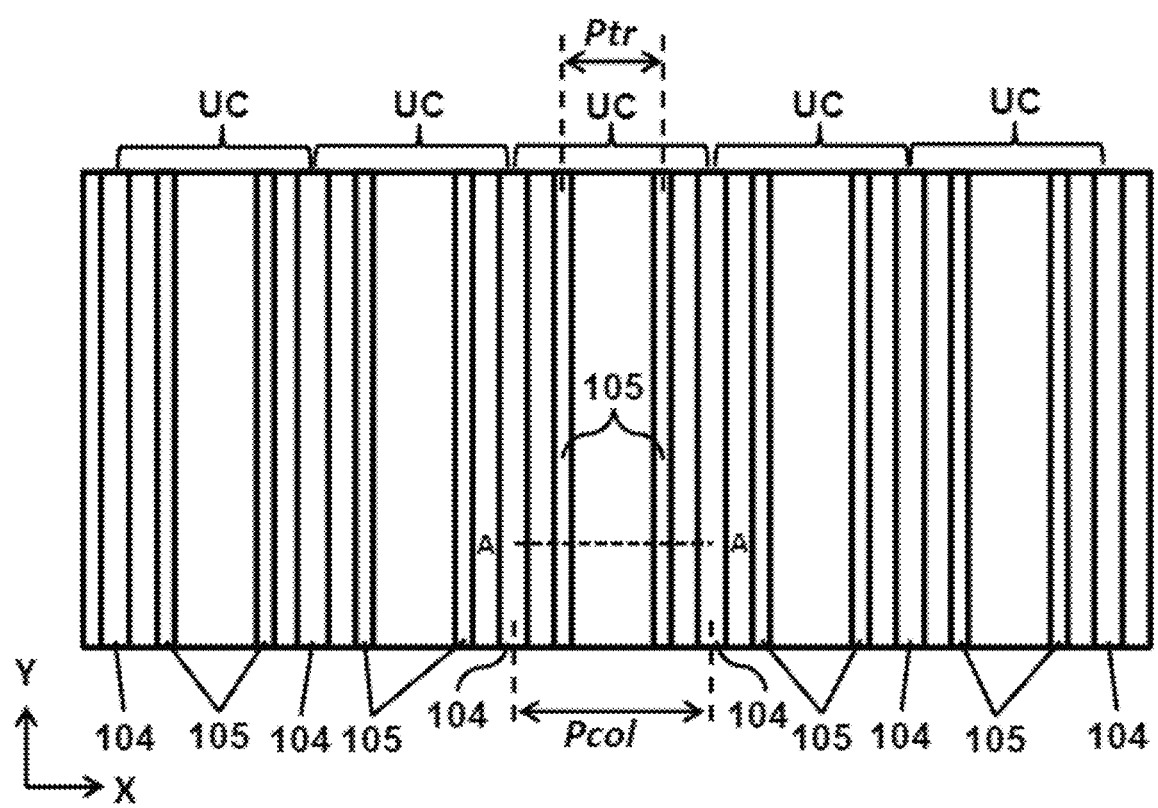
FIG. 2 is an enlarged plan view of a cell region indicated by a dotted line in FIG. 1.

FIG. 2 is an enlarged plan view of the cell region indicated by a dotted line 103 in FIG. 1. A plurality of p type column regions 104 and a plurality of trench gates 105 are arranged in parallel along the second direction Y. Each of an interval Pcol of the p type column regions 104 and an interval Ptr of the trench gates 105 is set to a constant interval, and the interval Pcol is set to twice the interval Ptr as a preferable vale in this embodiment. Further, when a width of the trench gate 105 in the first direction X is defined as Wtr, the unit cell UC is designed such that there is an overlap with the trench gate 105 which is twice or more the width Wtr when following a line virtually connecting the adjacent p type column regions 104.

Figure 3:
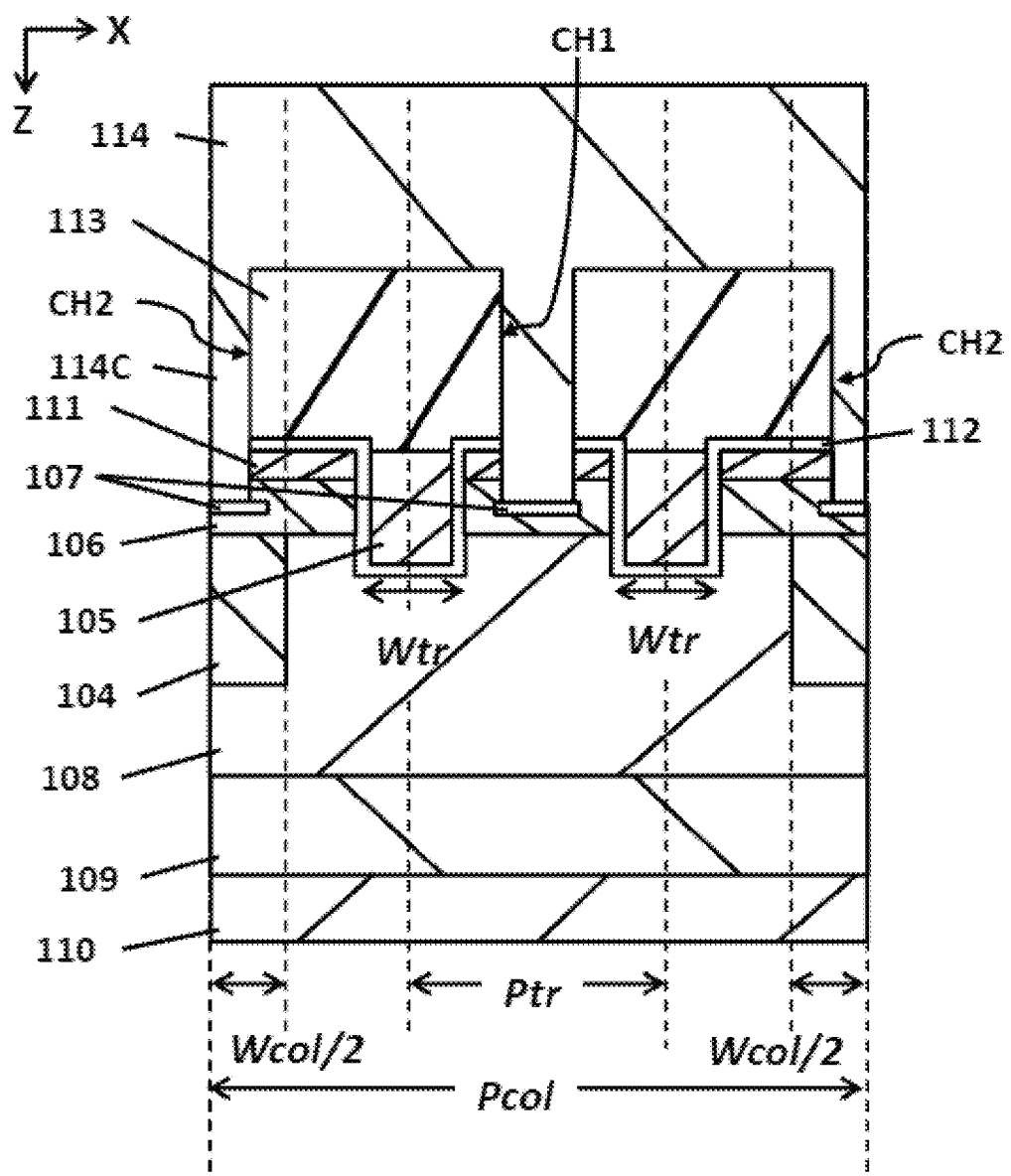
FIG. 3 is a cross-sectional view showing a principal part of a unit cell UC in FIG. 2.

FIG. 3 is a cross-sectional view showing a principal part of the unit cell UC in FIG. 2. FIG. 3 is a cross-sectional view along a line A-A in FIG. 2. As shown in FIG. 3, between the adjacent trench gates 105, a p type base region 106 and a $p^{+}$ type base contact region 107 are repeatedly formed in the first direction X in parallel at the interval Ptr.

Each unit cell UC of the vertical type MOSFET includes a drift region 108 formed of an $n^{-}$ type epitaxial layer formed in the semiconductor substrate 100, a drain region 109 formed of an $n^{+}$ type semiconductor layer with a high impurity concentration formed under the drift region 108, and a drain electrode 110 electrically connected to a lower surface of the drain region 109.

In the base region 106, a source region 111 formed of an $n^{+}$ type semiconductor layer with a high impurity concentration is formed. In a third direction Z which is the thickness direction of the semiconductor substrate 100, the source region 111 is formed so as to be shallower than the base region 106 and the p type column region 104 is formed so as to be deeper than the base region 106. Between the adjacent p type column regions 104, the trench gates 105 buried in the two trenches formed by etching the surface of the drift region 108 are formed. A gate oxide film 112 is formed at the interface between the drift region 108 and the trench gate 105. An insulating film 113 is formed on the upper surface of the drift region 108 so as to cover the trench gate 105 and the source region 111, and a source electrode 114 is formed on the upper surface of the insulating film 113.

The source electrode 114 is formed so as to reach the position deeper than the source region 111 and shallower than the base region 106 via a stripe-shaped contact hole CH1 formed in the insulating film 113 between the adjacent trench gates 105, and is connected to the base contact region 107. Further, the source electrode 114 is connected to the base contact region 107 formed on the column region 104 via a stripe-shaped contact hole CH2 formed in the insulating film 113.

Figure 4:
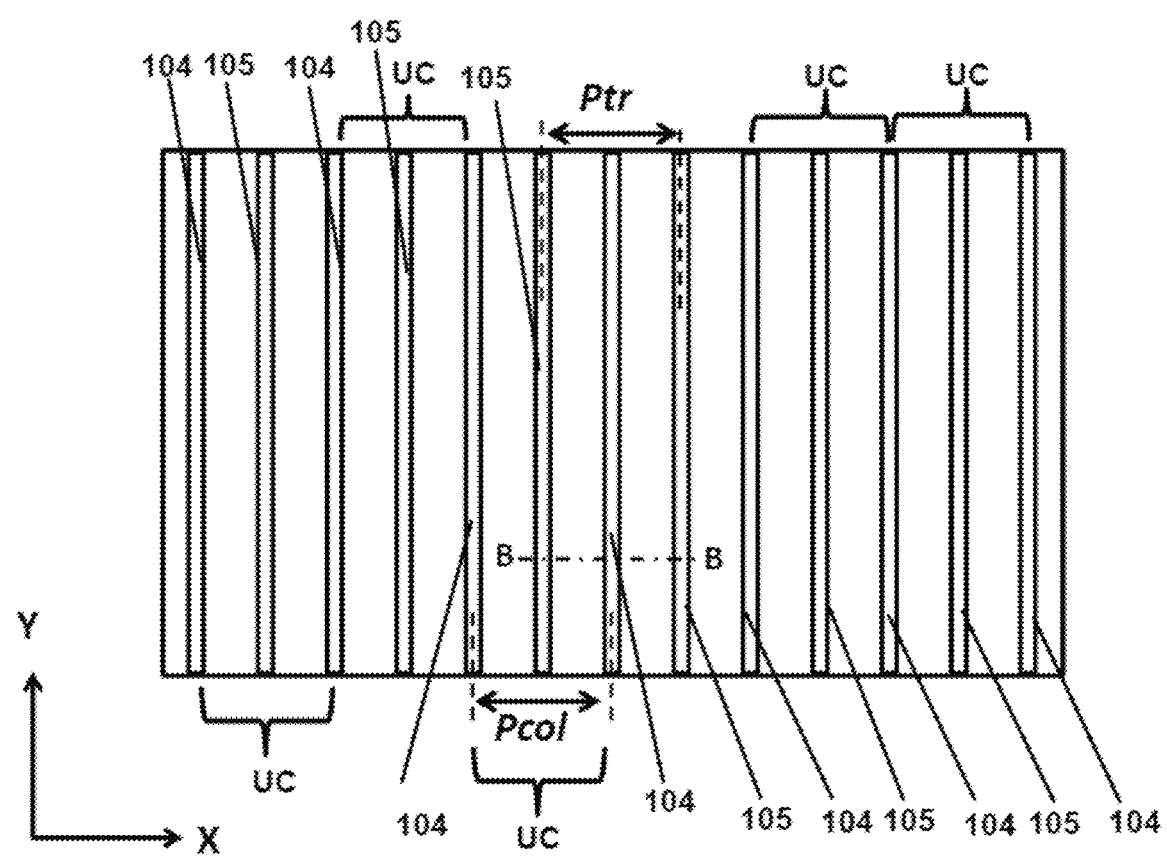
FIG. 4 is an enlarged plan view of a cell region of a semiconductor device having a vertical type MOSFET structure according to a comparative example.
Figure 5:
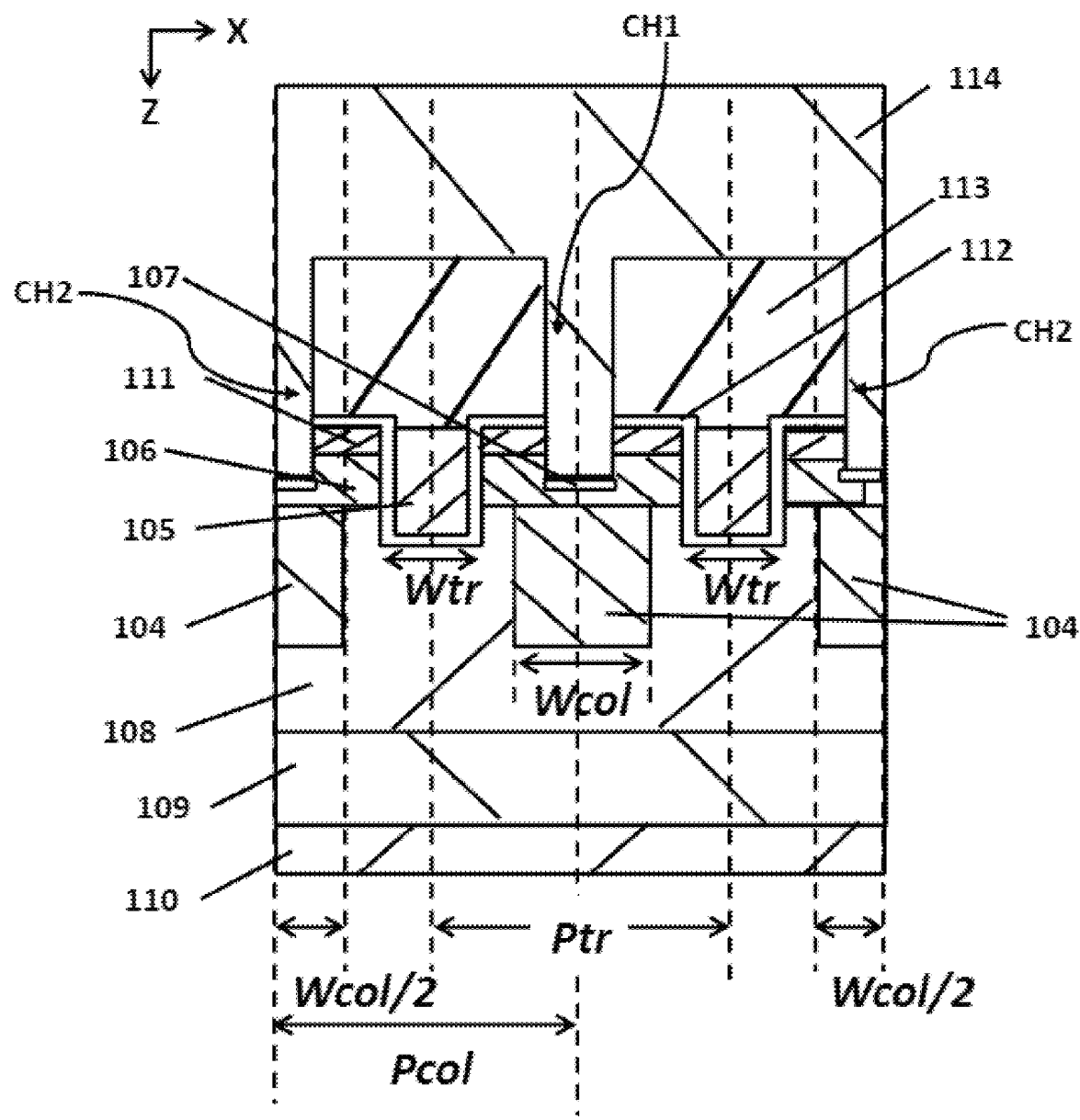
FIG. 5 is a cross-sectional view showing a principal part of a unit cell UC in FIG. 4.

For the comparison with the configuration of the vertical type MOSFET according to the first embodiment described above, FIGS. 4 and 5 show a comparative example of the vertical type MOSFET described with reference to FIGS. 2 and 3. FIG. 4 is an enlarged plan view of a cell region of a semiconductor device having a vertical type MOSFET structure according to the comparative example. FIG. 5 is a cross-sectional view showing a principal part of a unit cell UC in FIG. 5. Note that FIG. 5 is a cross-sectional view along a line B-B in FIG. 4. The vertical type MOSFET shown in FIGS. 4 and 5 is configured such that the p type column region 104 is always arranged between the adjacent trench gates 105. Namely, only one stripe-shaped trench gate 105 is arranged between the adjacent p type column regions 104 in plan view.

On the other hand, in the vertical type MOSFET according to the first embodiment, the occupancy of the p type column region 104 per unit cell UC in plan view is reduced as compared with the comparative example of FIGS. 4 and 5, so that a wider current path can be secured. Further, even when the repetition interval Ptr of the trench gate 105 is reduced to improve the gate density, the distance of the double of Ptr can be secured as the repetition interval Pcol of the p type column region and the drift region (referred to also as n column), so that the on-resistance can be reduced without the need to make the impurity concentrations of the p type column region and the drift region excessively high.

Figure 6:
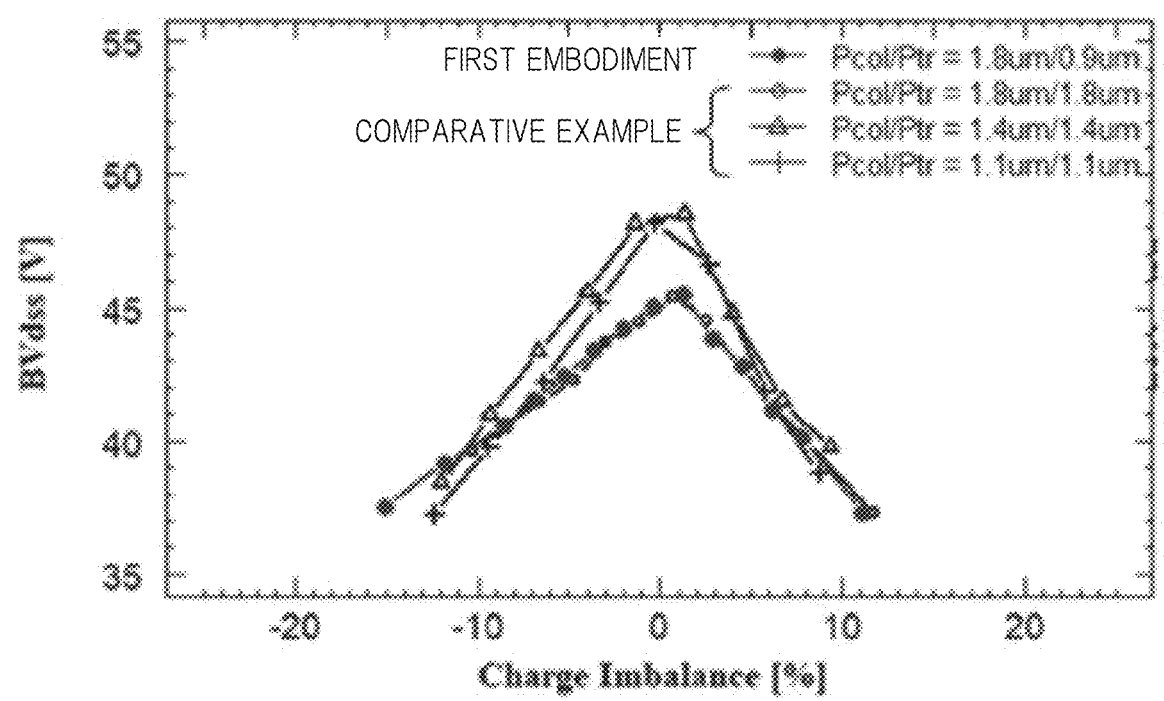
FIG. 6 is a graph showing a relationship of withstand voltage BVdss and normalized on-resistance Rsp in the vertical type MOSFET according to the first embodiment and the vertical type MOSFET according to the comparative example.
Figure 6:
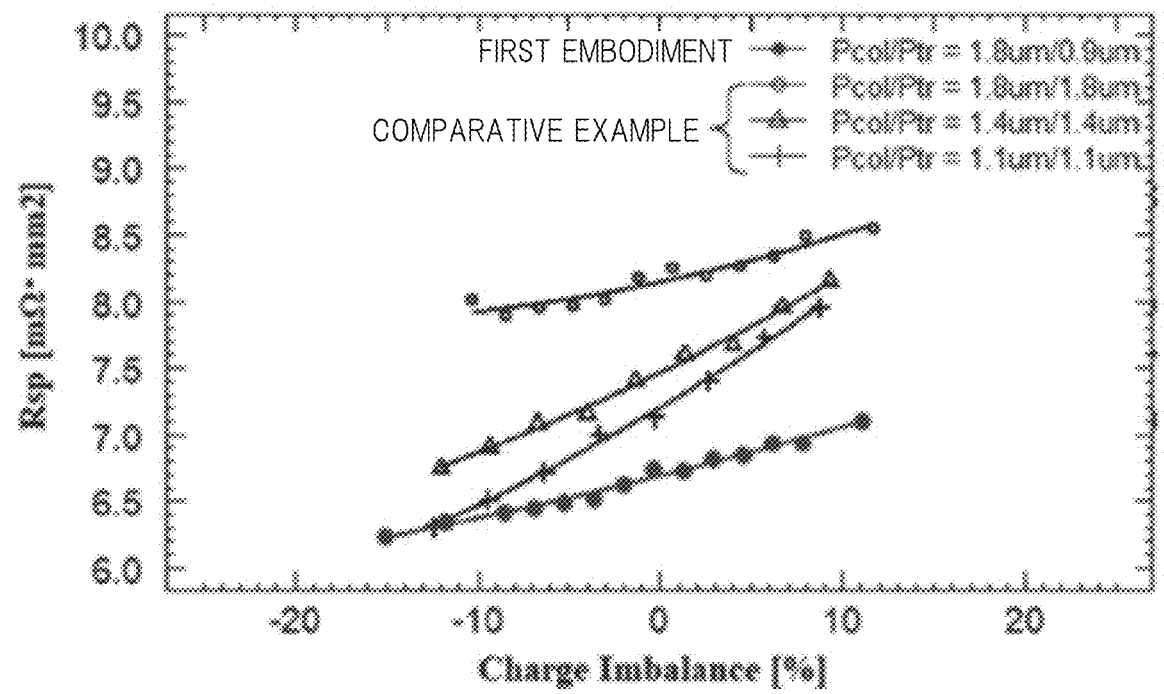

FIG. 6 shows a relationship between the charge imbalance rate (balance of the charge amount of the n type and p type column regions) of the charge amount of the p type column region/n type column region when the maximum withstand voltage of the vertical type MOSFET is obtained and the withstand voltage BVdss and a relationship between the charge imbalance rate and the normalized on-resistance Rsp.

In the comparative example of the vertical type MOSFET shown in FIGS. 4 and 5, it is necessary to reduce Pcol/Ptr and increase the concentrations of the p type column region and the n type column region in order to reduce the normalized on-resistance Rsp while keeping the charge imbalance margin capable of satisfying a certain withstand voltage or higher. Therefore, there is a problem that the sensitivities of the withstand voltage and the normalized on-resistance Rsp with respect to the charge imbalance rate become high.

On the other hand, in the vertical type MOSFET structure according to the first embodiment, the normalized on-resistance Rsp can be significantly reduced without increasing the sensitivities of the withstand voltage BVdss and the normalized on-resistance Rsp with respect to the charge imbalance rate. Therefore, not only the improvement in basic performance but also the reduction in manufacturing variations can be achieved, so that the manufacturing yield can also be improved.

Figure 7:
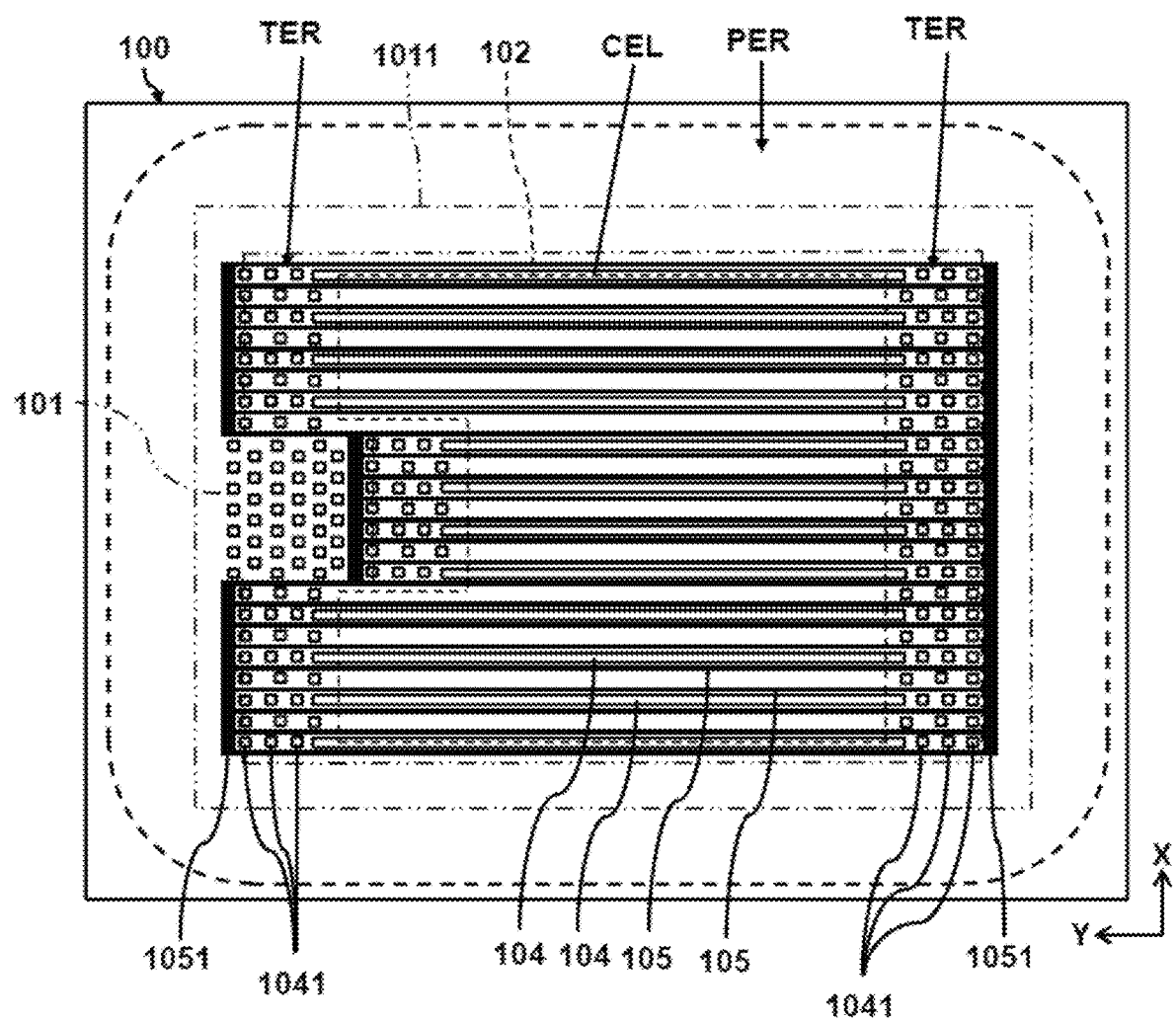
FIG. 7 is a plan view explaining a configuration of a termination portion of the semiconductor device having the vertical type MOSFET structure according to the first embodiment.
Figure 8:
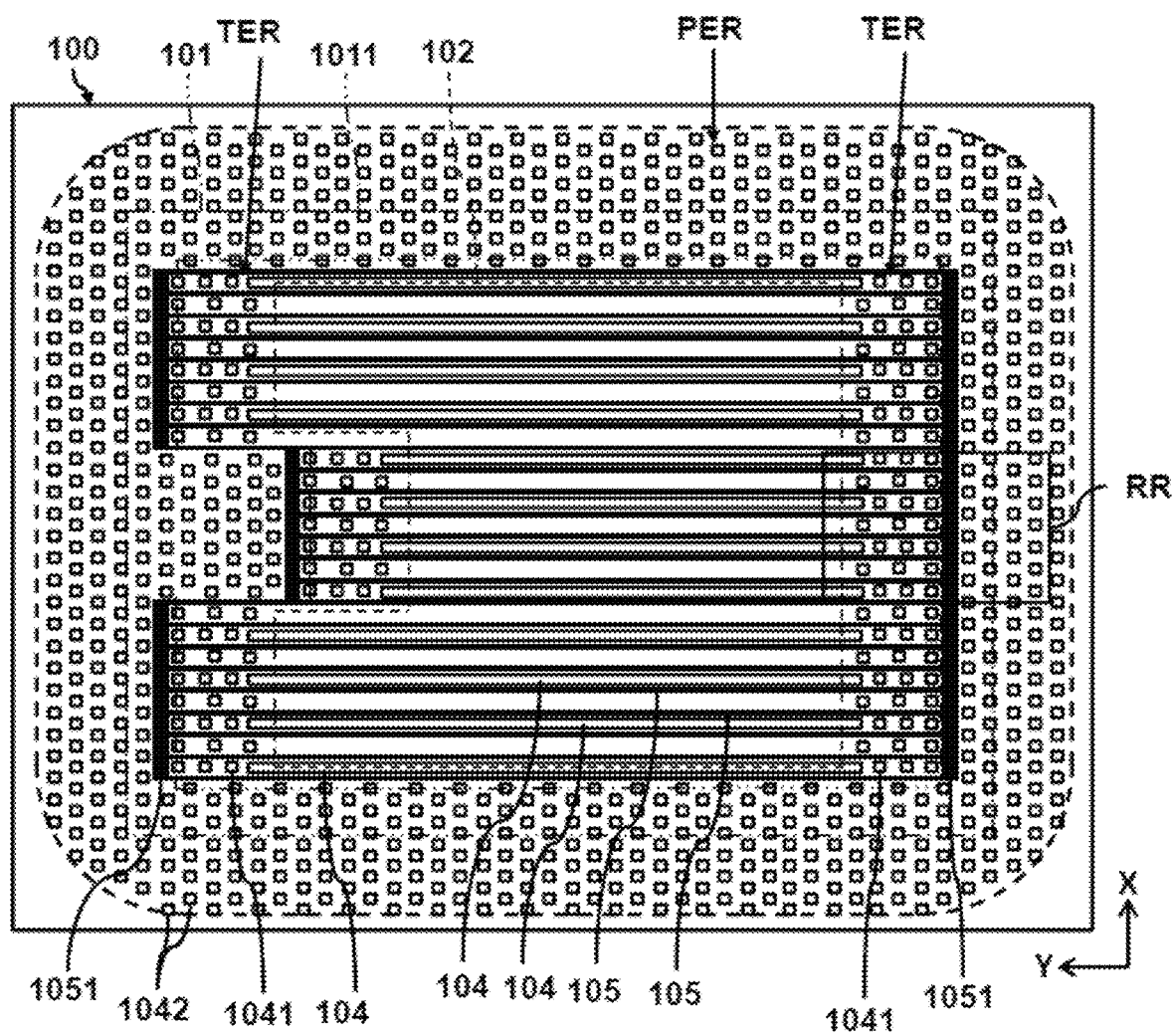
FIG. 8 is a plan view explaining a configuration of a peripheral portion of the semiconductor device having the vertical type MOSFET structure according to the first embodiment.

FIG. 7 is a plan view explaining the configuration of the termination portion of the semiconductor device having the vertical type MOSFET structure according to the first embodiment. FIG. 8 is a plan view explaining the configuration of the peripheral portion of the semiconductor device having the vertical type MOSFET structure according to the first embodiment.

As shown in FIG. 7, the plurality of p type column regions 104 and the plurality of trench gates 105 are provided so as to extend in the second direction Y in the cell portion CEL. The plurality of p type column regions 104 and the plurality of trench gates 105 are arranged in parallel in the second direction Y and are allayed in the first direction X. Each of the plurality of p type column regions 104 has the stripe shape. Two trench gates 105 are arranged between the two adjacent p type column regions 104. In the termination portion TER, the end portions of the p type column regions 104 and a plurality of p type column regions (second column regions) 1041 different from the p type column regions 104 (first column regions) are arranged along the second direction Y so as to be sandwiched between the two trench gates 105. Further, in the portion where the p type column region 104 is not provided, the plurality of p type column regions 1041 are arranged along the second direction Y so as to be sandwiched between the two trench gates 105. In an example, each of the plurality of p type column regions 1041 has a rectangular shape, and the plurality of p type column regions 1041 having a rectangular shape are arranged in dot pattern.

In addition, in the termination portion TER, a plurality of connection trench gates (referred to also as joint trench) 1051 are provided along the first direction X. Both ends of the plurality of trench gates 105 are connected to the connection trench gates 1051. Gate contact electrodes connected to the gate pad 101 and the wiring 1011 are connected to each of the connection trench gates 1051. The plurality of p type column regions 1041 are provided so as not to be in contact with the trench gate 105 and the connection trench gate 1051 in plan view. The width of the connection trench gate 1051 in the second direction Y is formed to be larger than the width of the trench gate 105 in the first direction X.

When the trench gate 105 terminates in the termination portion TER, since the curvature of the trench shape is large and the curvature of the gate oxide film on the inner wall is also large, the gate breakage is likely to occur. Therefore, the termination ends of the trench gates 105 are connected by the connection trench gate 1051 so as to reduce the curvature of the trench shape, thereby preventing the gate breakage. Also, gate polysilicon embedded in the connection trench gate 1051 is connected to the gate pad 101 and the wiring 1011. When the gate contact electrode is connected to the gate polysilicon embedded in the connection trench gate 1051 and connected to the gate pad 101 and the aluminum wiring of the wiring 1011, since there is a limit to the processing dimensions of the gate contact hole, the width of the connection trench gate 1051 in the second direction Y needs to be larger than the width of the trench gate 105 of the cell portion CEL in the first direction X.

Further, the plurality of p type column regions 1041 are provided under the gate pad 101.

Although the configuration in which two trench gates are provided between the two adjacent p type column regions is shown in FIG. 7, the configuration is not limited to this. The configuration in which two or two or more trench gates are provided between the two adjacent p type column regions may be adopted.

As shown in FIG. 8, a plurality of p type column regions (fifth column regions) 1042 are provided in the peripheral portion PER. In an example, the plurality of p type column regions 1042 are arranged in dot pattern. The connection trench gates 1051 are surrounded by the p type column regions (1041, 1042) arranged in dot pattern. Namely, in the termination portion TER, the dot-shaped p type column regions 1041 are arranged between the end portions of the stripe-shaped p-type column regions 104 extending from the cell portion CEL and the connection trench gates 1051 and between the trench gates 105 where the stripe-shaped p type column region 104 is not arranged. Further, the dot-shaped p type column regions 1042 are arranged in the peripheral portion PER on the outer side of the connection trench gates 1051. As a result, as will be described later, the region that is not depleted can be reduced, so that the withstand voltage of the semiconductor device 1 can be improved.

Figure 9:
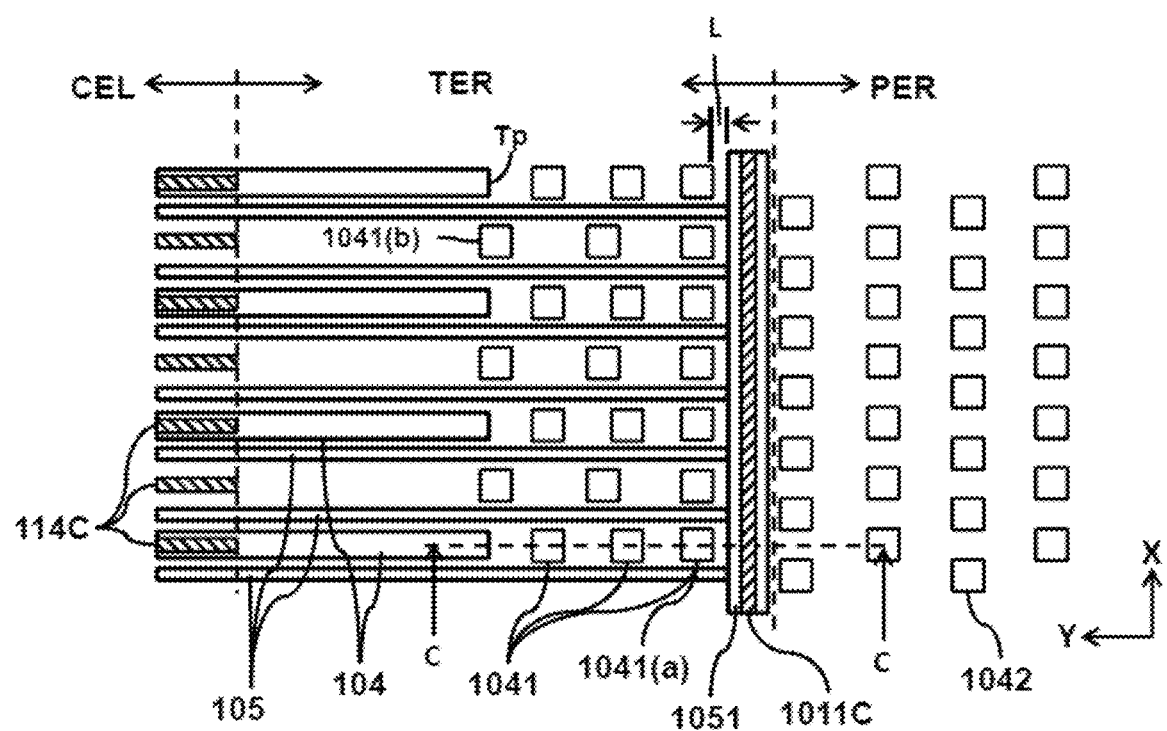
FIG. 9 is a plan view showing a rectangular region RR in FIG. 8 in an enlarged manner.
Figure 10:
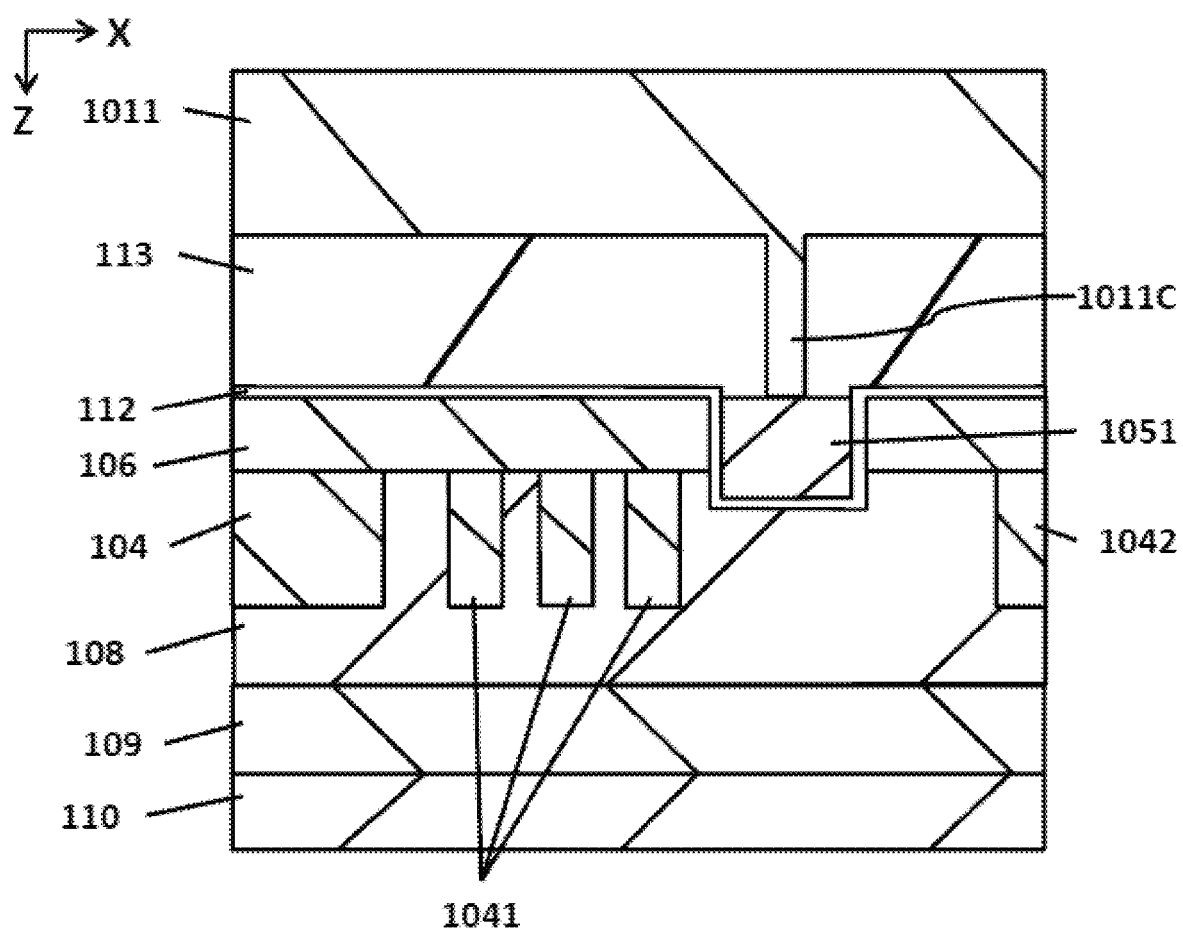
FIG. 10 is a cross-sectional view along a line C-C in FIG. 9.

FIG. 9 is a plan view showing a rectangular region RR in FIG. 8 in an enlarged manner. FIG. 10 is a cross-sectional view along a line C-C in FIG. 9. In FIG. 10, the components similar to those of FIG. 3 are denoted by the same reference signs and the description thereof is omitted.

As shown in FIG. 9, in the cell portion CEL, source contact electrodes 114C for connecting to the source electrode 114 (or source pad 102) are arranged above the p type column regions 104 and between the adjacent trench gates 105. The source electrode 114 is connected to the three base contact regions 107 shown in FIG. 3 by the source contact electrodes 114C.

In the termination portion TER, the trench gates 105 are connected to the connection trench gate 1051, and a gate contact electrode 1011C for connecting the wiring 1011 connected to the gate pad 101 and the connection trench gate 1051 is arranged on the connection trench gate 1051. Consequently, the polysilicon gate in the trench gate 105 is connected to the polysilicon gate of the connection trench gate 1051, and is connected via the gate contact electrode 1011C to the wiring 1011 connected to the gate pad 101.

The plurality of p type column regions (second column regions) 1041 arranged in the termination portion TER are arranged in the following manner.

1) The plurality of p type column regions 1041 are arranged between the end portion Tp of the stripe-shaped p type column region 104 extending from the cell portion CEL and the connection trench gate 1051. In an example, three p type column regions 1041 are arranged.

2) The plurality of p type column regions 1041 are arranged between the trench gates 105 where the stripe-shaped p type column region 104 is not arranged. In an example, three p type column regions 1041 are arranged.

3) A predetermined distance L is provided between each of the plurality of p type column regions 1041(a) (third column regions) arranged adjacent to the connection trench gate 1051 and the connection trench gate 1051. Namely, each of the plurality of p type column regions 1041(a) arranged most adjacent to the connection trench gate 1051 is arranged apart by the predetermined distance L so as not to overlap the connection trench gate 1051 in plan view. In an example, the plurality of p type column regions 1041(a) are arranged to be aligned in the first direction X. This makes it possible to prevent the gate oxide film provided in the connection trench gate 1051 from being damaged due to the implantation of boron ions used when forming the plurality of p type column regions 1041. Therefore, the reliability of the semiconductor device 1 can be improved.

4) In the plurality of p type column regions 1041 arranged between the trench gates 105 where the stripe-shaped p type column region 104 is not arranged, each of the plurality of p type column regions 1041(b) (fourth column regions) arranged most adjacent to the cell portion CEL is arranged between the end portions Tp of the two p type column regions 104.

5) In the plurality of p type column regions 1041 other than the plurality of p type column regions 1041(a), the two p type column regions 1041 arranged between the end portion Tp of the p type column regions 104 and the p type column region 1041(a) and the two p type column regions 1041 arranged between the trench gates 105 where the p type column region 104 is not arranged are not aligned in the second direction Y and are arranged while being shifted in position. Namely, the pitch for arranging the three p type column regions 1041 arranged between the end portion Tp of the p type column region 104 and the p type column region 1041(a) is narrower than the pitch for arranging the three p type column regions 1041 arranged between the trench gates 105 where the p type column region 104 is not arranged.

In the manner described above, the plurality of p type column regions 1041 are arranged in the termination portion TER. Consequently, as described later, it is possible to reduce the region that is not depleted or the region that is hard to be depleted. Therefore, the withstand voltage of the semiconductor device 1 can be improved.

Note that the number, the shape, and the arrangement of the p type column regions 1041 are preferably determined by the relationship between the impurity concentration of the p type column region 1041 and the impurity concentration of the drift region 108 and the relationship between the charge of the p type column region 1041 and the charge of the drift region 108. Further, in FIGS. 7, 8, and 9, the p type column region 104 is drawn in a rectangular shape, but the shape is not limited to this. The corners of the end portion Tp of the p type column region 104 may have a rounded shape. Namely, the p type column region 104 may be formed in a stripe shape with both ends rounded. Further, each of the plurality of p type column regions 1041 and 1042 is drawn in a rectangular shape, but the shape is not limited to this. The corners of each of the plurality of p type column regions 1041 and 1042 may have a rounded shape. Also, each of the plurality of p type column regions 1041 and 1042 may have a circular shape or an elliptical shape.

As shown in FIG. 10, the p type column regions 1041 and 1042 are formed simultaneously with the p type column regions 104 and are provided under the base region 106 so as to be in contact with the base region 106. The p type column regions 1041 are formed between the p type column regions 104 and the connection trench gates 1051. The connection trench gates 1051 are formed between the p type column regions 1041 and the p type column regions 1042. The gate oxide film 112 is formed on the upper surface of the base region 106, between both side surfaces of the connection trench gate 1051 and the base region 106, and between the drift region 108 and the bottom surface of the trench gate 105. The connection trench gate 1051 is formed so as to be buried in the trench (groove) formed by etching the surface of the drift region 108. The insulating film 113 is formed so as to cover the upper surface of the gate oxide film 112 and the upper surface of the connection trench gate 1051 excluding the connection portion of the gate contact electrode 1011C, and the wiring 1011 connected to the gate pad 101 is formed on the upper surface of the insulating film 113. The wiring 1011 is connected to the polysilicon gate of the connection trench gate 1051 by the gate contact electrode 1011C.

COMPARATIVE EXAMPLE

Figure 11:
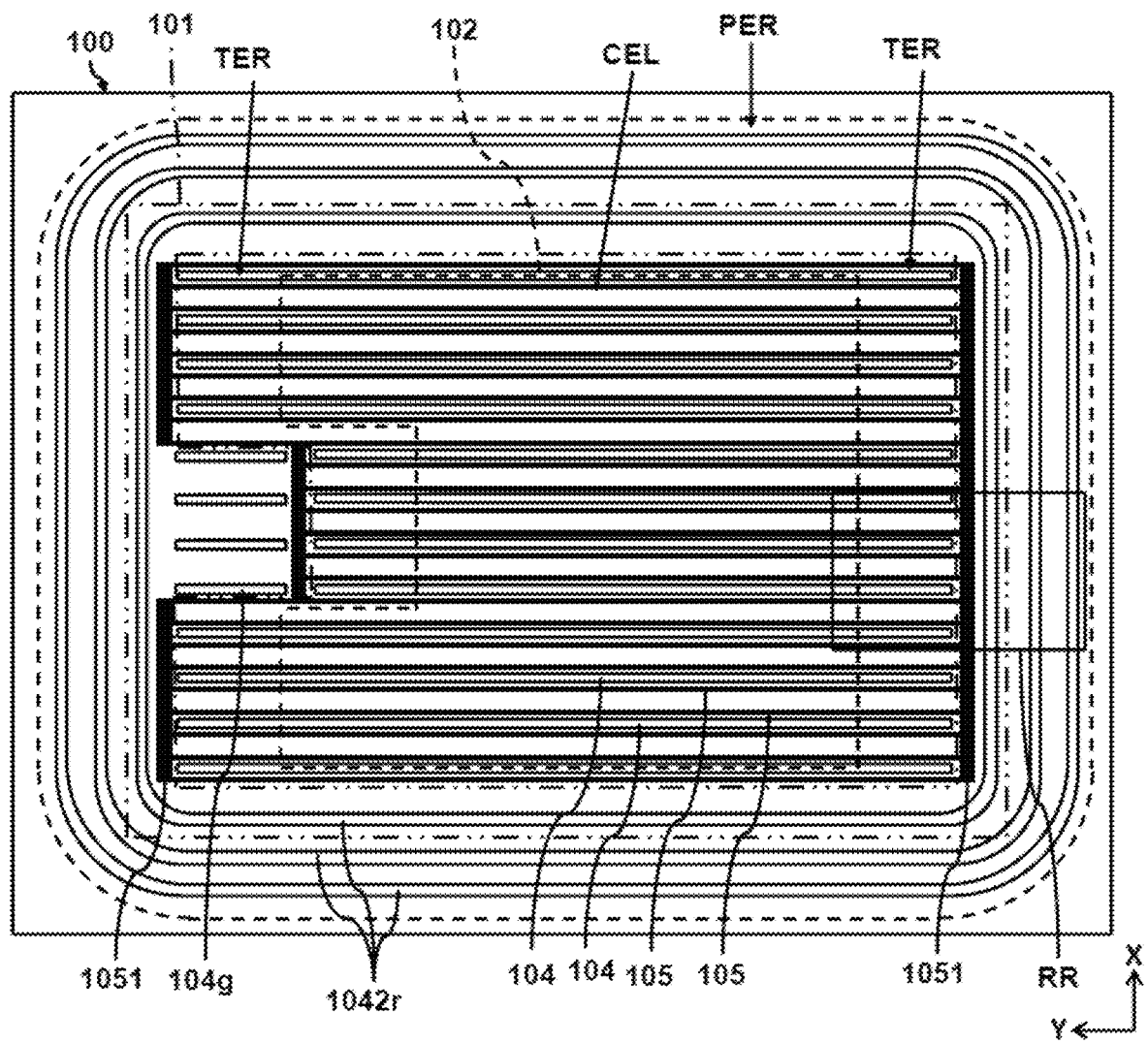
FIG. 11 is a plan view explaining a configuration of a termination portion of a semiconductor device having a vertical type MOSFET structure according to a comparative example.

Next, a comparative example to FIG. 8 will be described. FIG. 11 is a plan view explaining a configuration of a termination portion of a semiconductor device having a vertical type MOSFET structure according to the comparative example. The difference between FIG. 11 and FIG. 8 is that the stripe-shaped p type column regions 104 extending from the cell portion CEL are arranged up to the vicinity of the connection trench gates 1051 in the termination portion TER of FIG. 11. Further, in FIG. 11, three p type column regions 1042r formed in an annular shape (ring shape) or an arc shape are arranged in the peripheral portion PER so as to surround the cell portion CEL and the termination portion TER. Further, a plurality of stripe-shaped p type column regions 104g are arranged under the gate pad 101.

Figure 12:
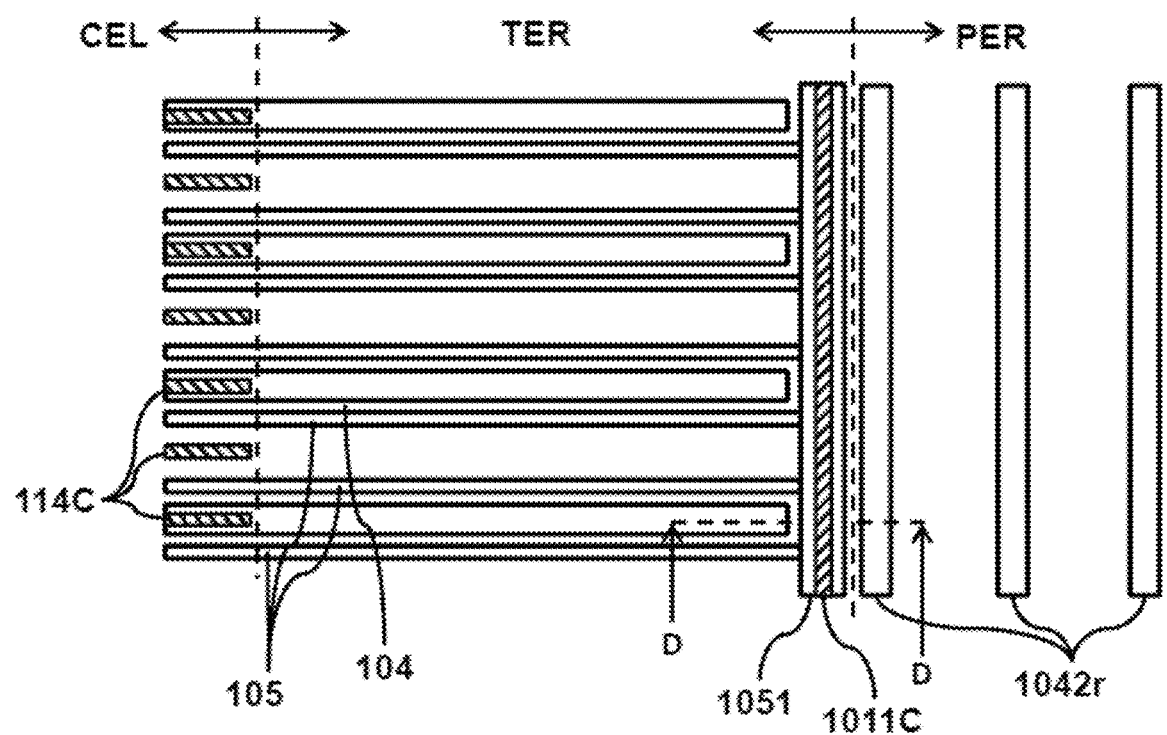
FIG. 12 is a plan view showing a rectangular region RR in FIG. 11 in an enlarged manner.
Figure 13:
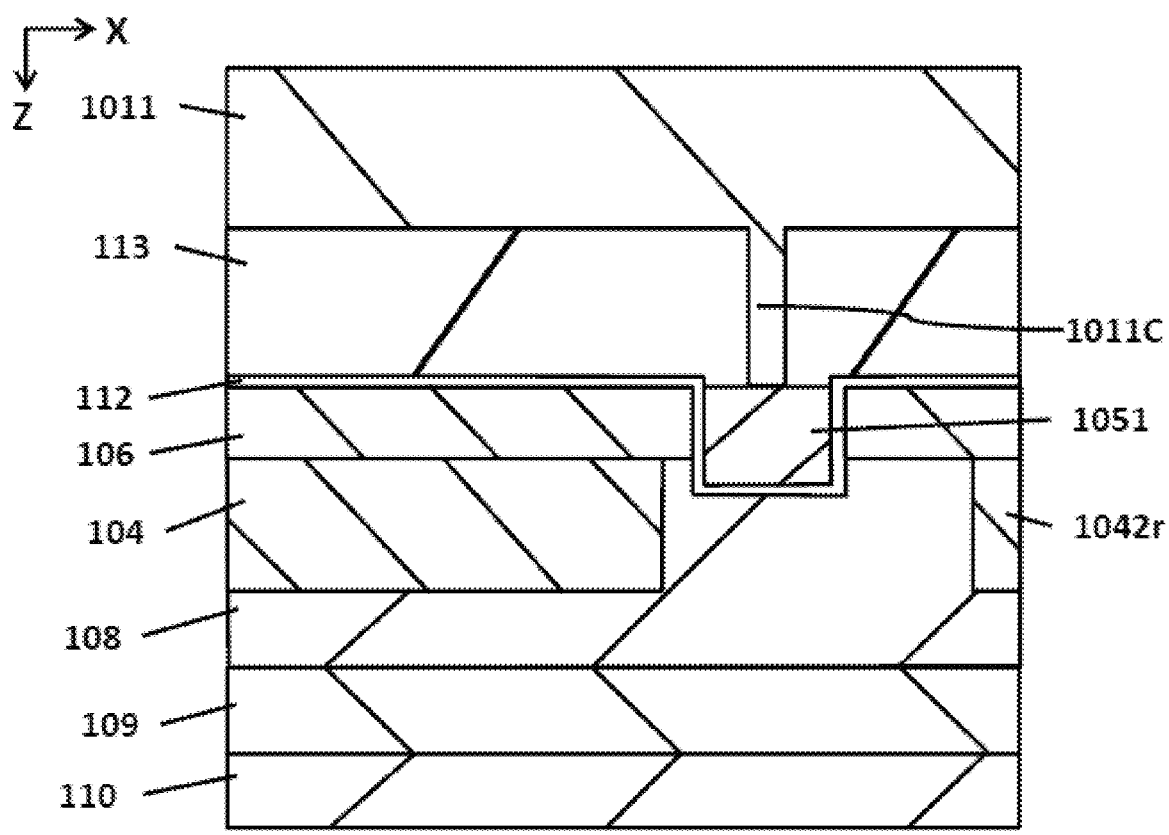
FIG. 13 is a cross-sectional view along a line D-D in FIG. 12.

FIG. 12 is a plan view showing a rectangular region RR in FIG. 11 in an enlarged manner. FIG. 13 is a cross-sectional view along a line D-D in FIG. 12. In FIG. 13, the components similar to those of FIG. 10 are denoted by the same reference signs and the description thereof is omitted. The difference between FIGS. 12 and 13 and FIGS. 9 and 10 is that the stripe-shaped p type column regions 104 extending from the cell portion CEL are arranged up to the vicinity of the connection trench gates 1051 as described with reference to FIG. 11. Further, the p type column regions 1042r are arranged in the peripheral portion PER.

Figure 14:
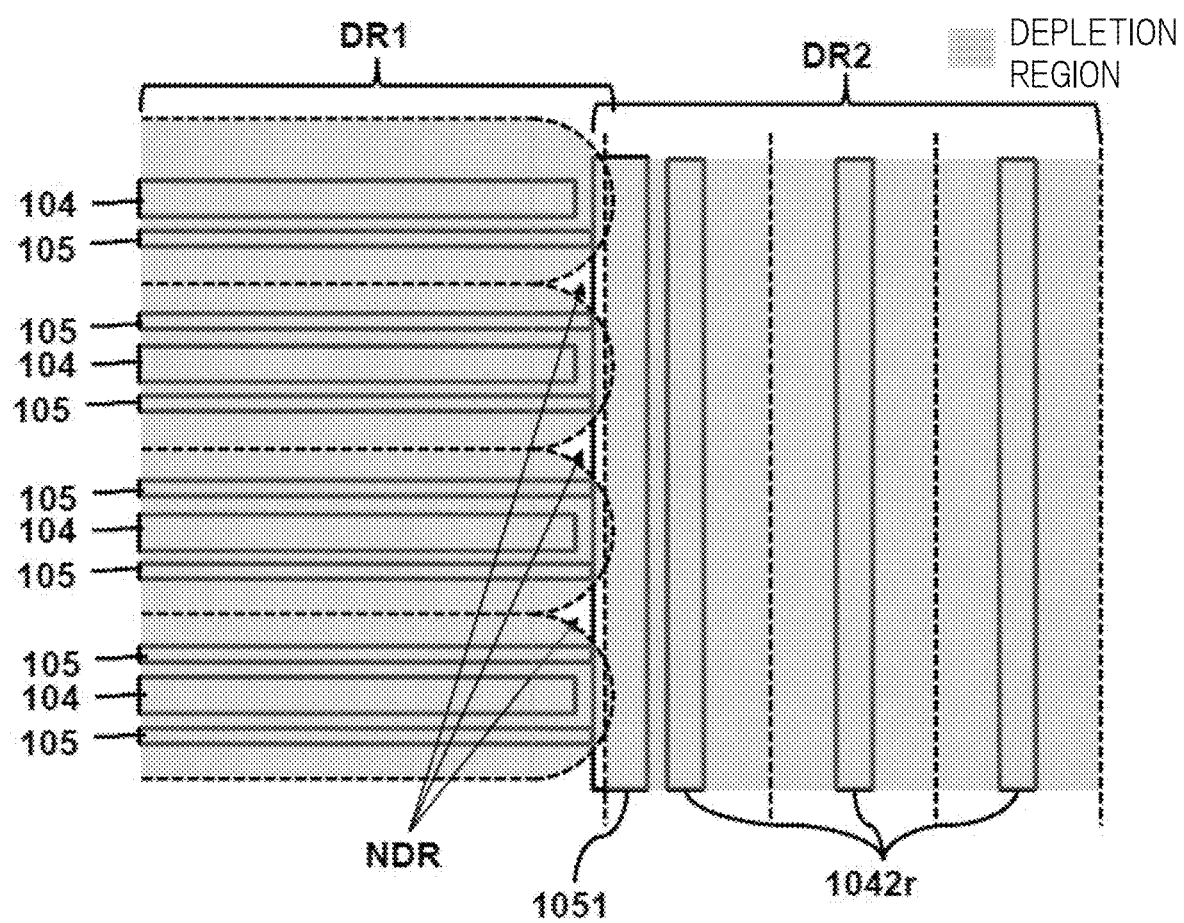
FIG. 14 is a plan view explaining a depletion region in FIG. 12.

FIG. 14 is a plan view explaining the depletion region in FIG. 12. The drift region 108 is depleted by applying the voltage between the drain which is the drift region 108 and the source which is the p type column region 104. FIG. 14 shows the state of the depletion layer generated from the stripe-shaped p type column regions 104 and the p type column regions 1042r as a gray region (depletion region). In FIG. 14, a depletion region DR1 indicates the region in which the depletion layer based on the stripe-shaped p type column regions 104 spreads. A depletion region DR2 indicates the region in which the depletion layer based on the annular p type column regions 1042*r* spreads. As shown in FIG. 14, regions NDR where the depletion region DR1 and the depletion region DR2 do not overlap (region that is not depleted or non-depleted region) may occur in some cases. Therefore, the withstand voltage of the semiconductor device is lowered.

Figure 15:
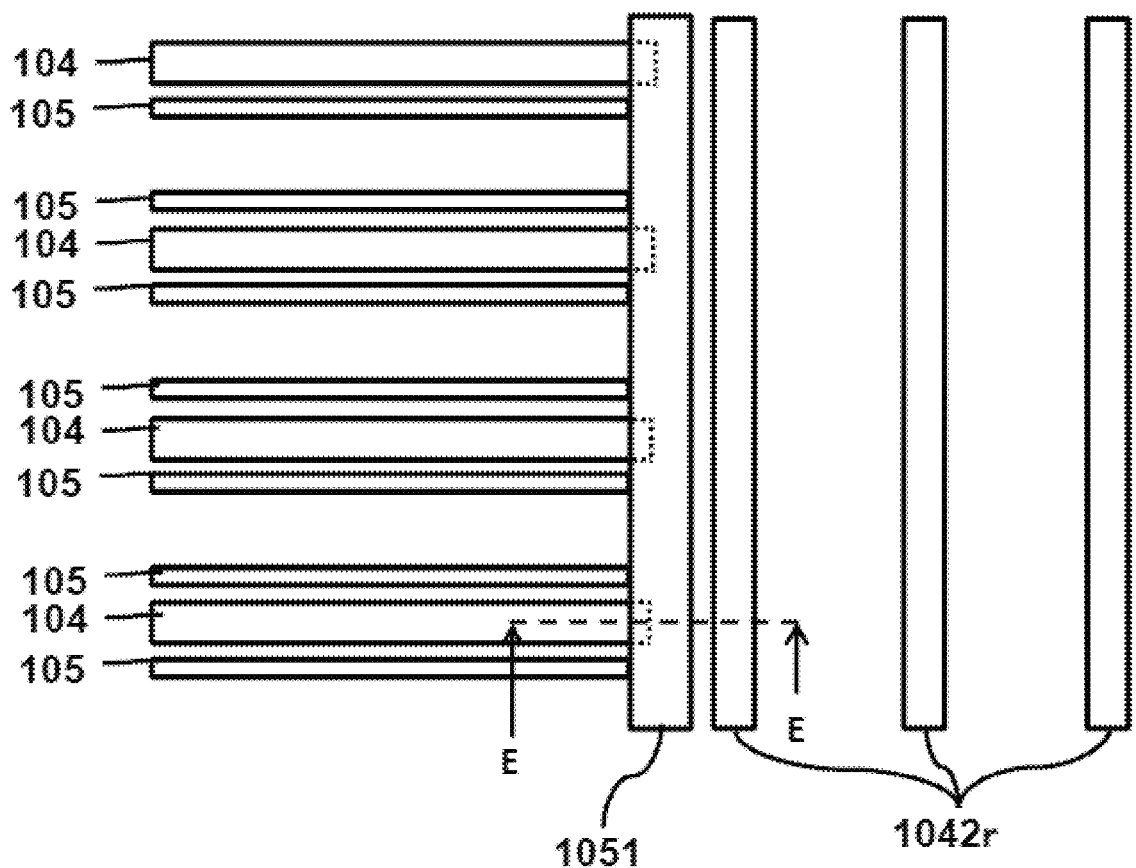
FIG. 15 is a plan view explaining a state where stripe-shaped p type column regions are extended to a lower side of the connection trench gate.
Figure 16:
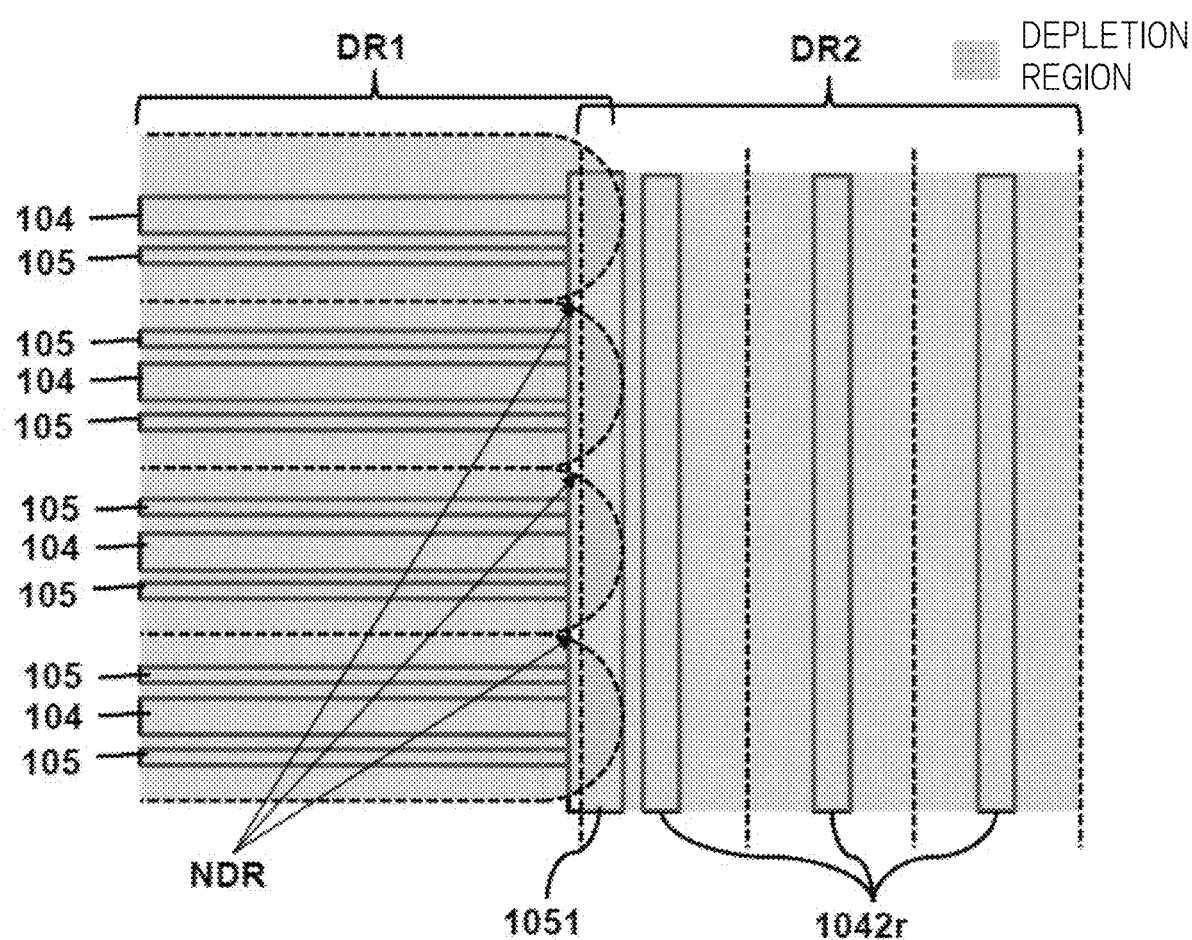
FIG. 16 is a plan view explaining a depletion region in FIG. 15.
Figure 17:
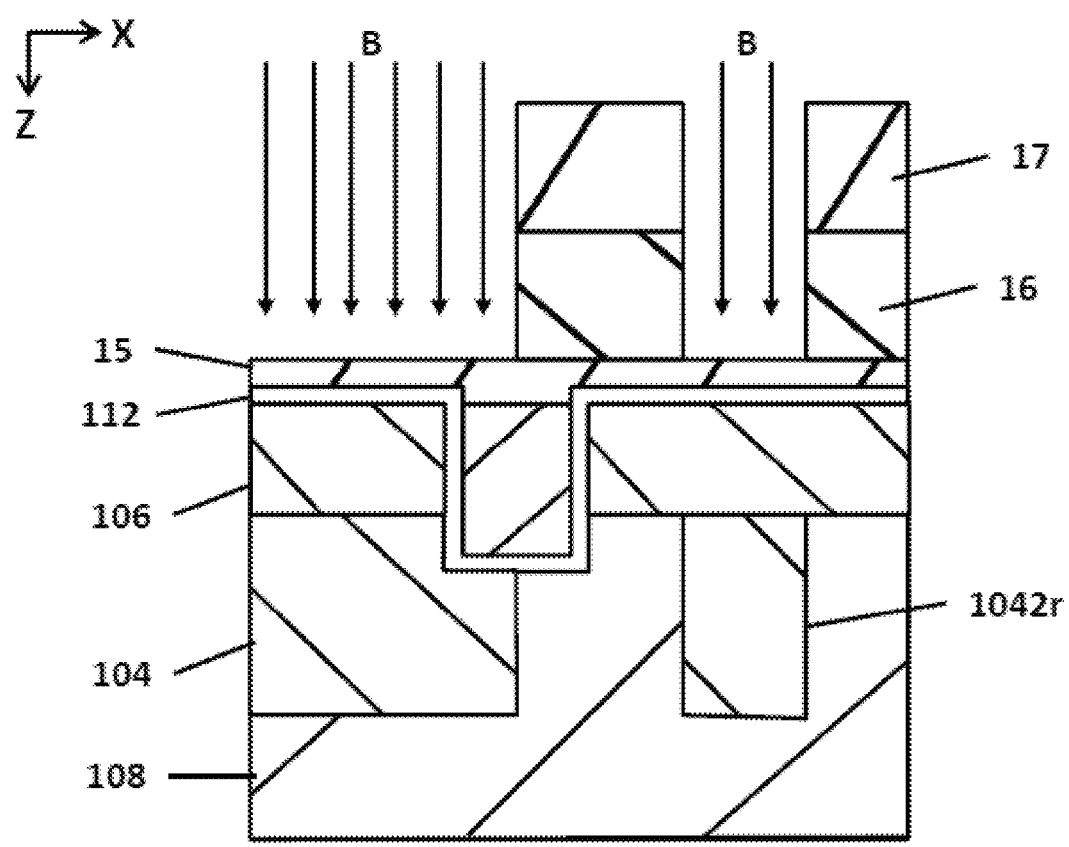
FIG. 17 is a partial cross-sectional view corresponding to a cross-section along a line E-E in FIG. 15, explaining a manufacturing process of stripe-shaped p type column regions and annular p type column regions.

As a countermeasure for this, that is, as a method of reducing the area of the non-depleted regions NDR, a method of extending the stripe-shaped p type column regions 104 to the lower side of the connection trench gate 1051 can be considered. FIG. 15 is a plan view explaining the state in which the stripe-shaped p type column regions 104 are extended to the lower side of the connection trench gate 1051. FIG. 16 is a plan view explaining the depletion region in FIG. 15. FIG. 17 is a partial cross-sectional view corresponding to the cross section along a line E-E in FIG. 15, explaining the manufacturing process of the stripe-shaped p type column regions 104 and the annular p type column regions 1042*r*.

When the tip ends of the stripe-shaped p type column regions 104 are extended to the lower side of the connection trench gate 1051 as shown in FIG. 15, the depletion region DR1 in FIG. 16 indicates the region where the depletion layer based on the stripe-shaped p type column regions 104 spreads as in FIG. 14. The depletion region DR2 indicates the region where the depletion layer based on the annular p type column regions 1042*r* spreads. As shown in FIG. 16, the area of the region (region that is not depleted or non-depleted region) NDR where the depletion region DR1 and the depletion region DR2 do not overlap can be reduced as compared with the area of the non-depleted region NDR in FIG. 14. However, when the p type column regions 104 and 1041*r* are formed by using a hard mask composed of insulating films 15 and 16 and a photoresist film 17 as an ion implantation mask for boron B as shown in FIG. 17, the gate oxide film 112 may be damaged by the ion implantation for forming the p type column regions 104 and 1041*r*. In this case, there is a concern that the reliability of the semiconductor device may be deteriorated.

(Explanation of Depletion Region in FIG. 9)

Figure 18:
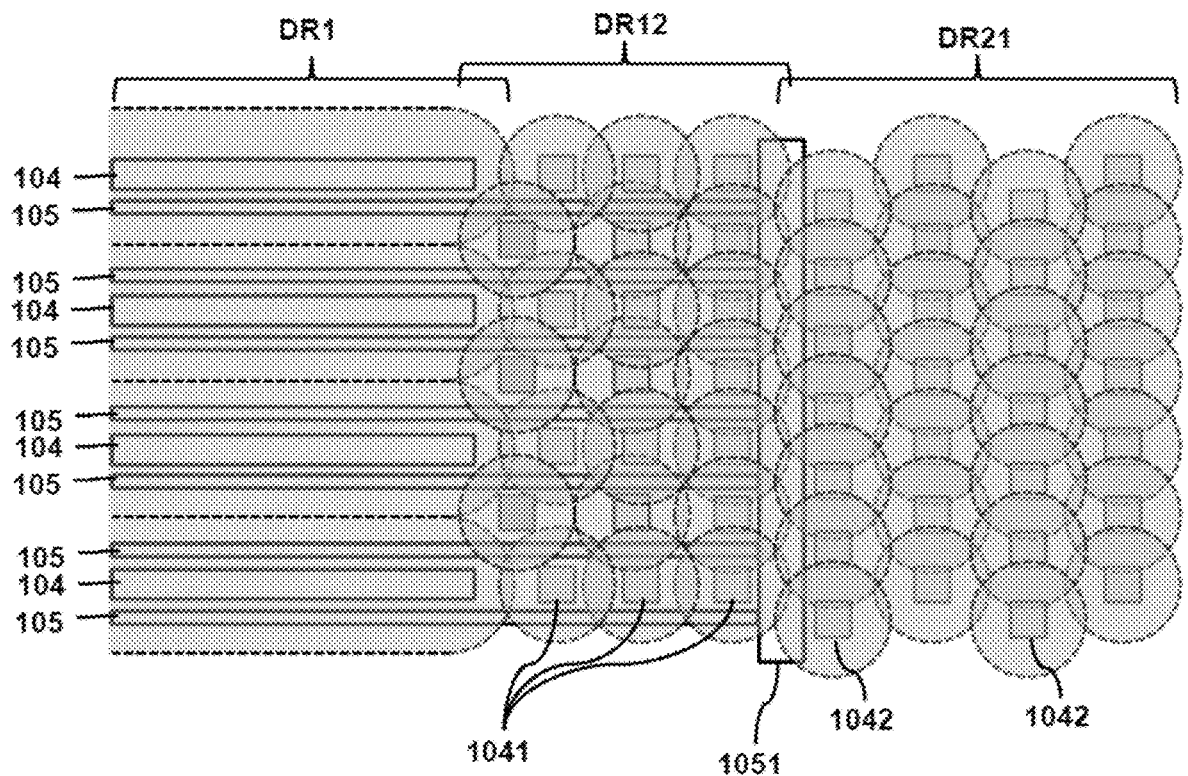
FIG. 18 is a plan view explaining a depletion region in FIG. 9.

FIG. 18 is a plan view explaining the depletion region in FIG. 9. In FIG. 18, the depletion region DR1 indicates the region (range) where the depletion layer based on the strip-shaped p type column regions 104 spreads. A depletion region DR12 indicates the region (range) where the depletion layer based on the p type column regions 1041 arranged in dot pattern spreads. A depletion region DR21 indicates the region (range) where the depletion layer based on the p type column regions 1042*r* arranged in dot pattern spreads. As shown in FIG. 18, the depletion regions DR1, DR12, and DR21 overlap, and the non-depleted regions NDR shown in FIG. 14 and FIG. 16 are reduced. In this example, the non-depleted region NDR does not occur.

When the non-depleted region is present in the drift region 108, the drain voltage is left as it is in this region and the field intensity is likely to increase, so that the avalanche breakdown occurs at a low drain voltage and current flows. As a result, the withstand voltage of the semiconductor device is lowered.

Since the semiconductor device 1 according to the first embodiment has the structure in which the p type column regions 104 have the stripe shape and two or more trench gates 105 are provided between the adjacent p type column regions 104 in the cell portion CEL, the interval between the two p type column regions 104 is wide and the depletion occurs widely. Therefore, there is a concern that the non-depleted regions NDR occur in the minute regions in the vicinity of the connection trench gate 1051 in the termination portion TER as shown in FIG. 14. In the first embodiment, as shown in FIG. 8 and FIG. 9, the dot-shaped p type column regions 1041 are arranged in those regions (corresponding to the non-depleted regions NDR), so that the non-depleted regions NDR are reduced. In addition, in the termination region TER, the dot-shaped p type column regions 1041 are arranged in the region between the trench gates 105 where the stripe-shaped p type column region 104 is not arranged, thereby reducing the non-depleted regions NDR (see FIG. 18). Consequently, since the increase of the field intensity can be suppressed, it is possible to prevent the reduction of the withstand voltage of the semiconductor device 1.

The region where the dot-shaped p type column regions 1041 are newly arranged in the semiconductor device 1 is not the cell portion CEL but the termination portion TER. Since the termination portion TER is a separation portion of the gate electrode and the source electrode, the on-current path of the vertical type MOSFET is not impaired even when the dot-shaped p type column regions 1041 are arranged in the termination portion TER. Therefore, the on-resistance of the vertical type MOSFET is not increased and the low value can be maintained. Accordingly, the characteristics of the vertical type MOSFET are not deteriorated.

According to the first embodiment, the following one or plural effects can be obtained.

1) It is possible to reduce the on-resistance of the semiconductor device including the vertical type MOSFET having the SJ structure.

2) It is possible to improve the withstand voltage in the termination portion TER in the semiconductor device including the vertical type MOSFET having the SJ structure. Consequently, it is possible to improve the withstand voltage of the semiconductor device. Further, the improvement in the withstand voltage can be achieved without additional process.

3) It is possible to prevent the gate insulating film of the connection trench gate 1051 from being damaged in the semiconductor device including the vertical type MOSFET having the SJ structure. Consequently, the reliability of the semiconductor device can be improved.

Next, some modifications of the p type column regions arranged in the termination portion TER and the peripheral portion PER will be described. Although the illustrations of the source contact electrode 114C and the gate contact electrode 1011C are omitted in the first to third modifications described below, it is assumed that the source contact electrode 114C and the gate contact electrode 1011C are provided as in FIG. 9.

(First Modification)

Figure 19:
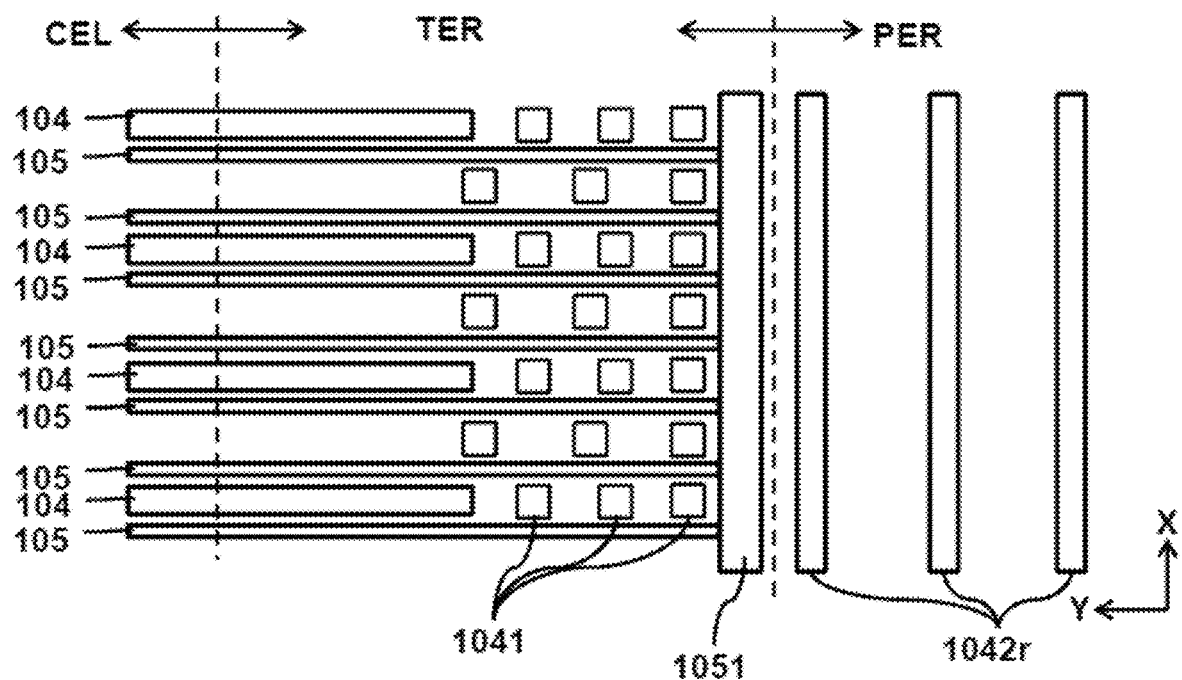
FIG. 19 is a plan view showing p type column regions arranged in a termination portion and a peripheral portion according to the first modification.

FIG. 19 is a plan view showing the p type column regions arranged in the termination portion and the peripheral portion according to the first modification. The difference between FIG. 19 and FIG. 12 is that the three annular p type column regions 1042*r* described with reference to FIG. 11 are arranged in the peripheral portion PER in FIG. 19. Since the other configuration in FIG. 19 is the same as that of FIG. 12, the description thereof is omitted. The same effect as the first embodiment can be obtained also in the first modification.

(Second Modification)

Figure 20:
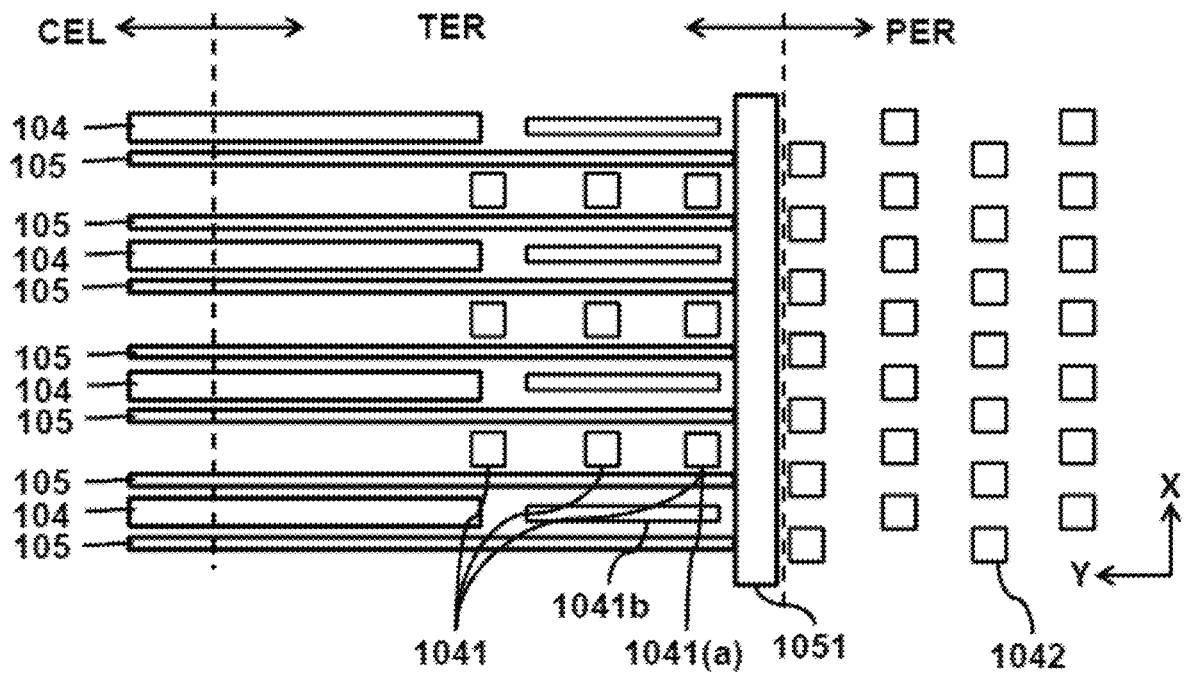
FIG. 20 is a plan view showing p type column regions arranged in a termination portion and a peripheral portion according to the second modification.

FIG. 20 is a plan view showing the p type column regions arranged in the termination portion and the peripheral portion according to the second modification. The difference between FIG. 20 and FIG. 12 is that stripe-shaped p type column regions 1041*b* are arranged between the end portions of the stripe-shaped p type column regions 104 extending from the cell portion CEL and the connection trench gate 1051 in FIG. 20. The width of the p type column region 1041*b* in the first direction X is formed to be smaller than the width of the p type column region 104 in the first direction X. The distance between the end portion of the p type column region 1041*b* and the connection trench gate 1051 is made equal to the distance L (see FIG. 12) between the p type column region 1041(*a*) and the connection trench gate 1051. Since the other configuration in FIG. 20 is the same as that of FIG. 12, the description thereof is omitted. The same effect as the first embodiment can be obtained also in the second modification.

Note that the three annular p type column regions 1042*r* described with reference to FIG. 19 may be arranged in the peripheral portion PER in FIG. 20.

(Third Modification)

Figure 21:
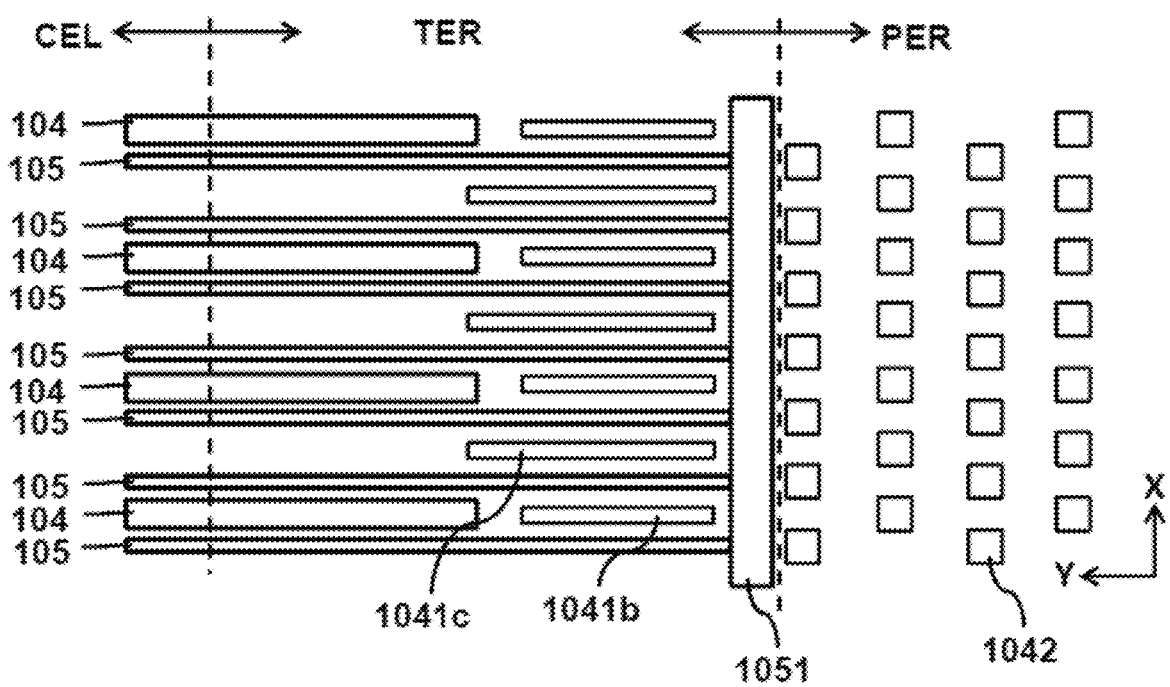
FIG. 21 is a plan view showing p type column regions arranged in a termination portion and a peripheral portion according to the third modification.

FIG. 21 is a plan view showing the p type column regions arranged in the termination portion and the peripheral portion according to the third modification. The difference between FIG. 21 and FIG. 20 is that stripe-shaped p type column regions 1041*c* are arranged between the trench gates 105 where the stripe-shaped p type column region 104 is not arranged in FIG. 21. The width of the p type column region 1041*c* in the first direction X is formed to be smaller than the width of the p type column region 104 in the first direction X. The width of the p type column region 1041*c* may be made equal to the width of the p type column region 1041*b*. The distance between the end portions of the p type column regions 1041*b* and 1041*c* and the connection trench gate 1051 is made equal to the distance L (see FIG. 12) between the p type column region 1041(*a*) and the connection trench gate 1051. The length of the p type column region 1041*c* in the second direction Y (length in the longitudinal direction) is made lager than the length of the p type column region 1041*b* in the second direction Y (length in the longitudinal direction). The p type column regions 1041*c* are arranged such that the end portions of the p type column regions 1041*c* on the side opposite to the side of the connection trench gate 1051 overlap, in the first direction X, the end portions of the stripe-shaped p type column regions 104 extending from the cell portion CEL in the second direction Y. Since the other configuration in FIG. 21 is the same as that of FIG. 20, the description thereof is omitted. The same effect as the first embodiment can be obtained also in the third modification.

(Fourth Modification)

In FIG. 21, the p type column regions 1041*b* may be replaced with the three dot-shaped p type column regions 1041 shown in FIG. 8 and FIG. 19.

Second Embodiment

Figure 22:
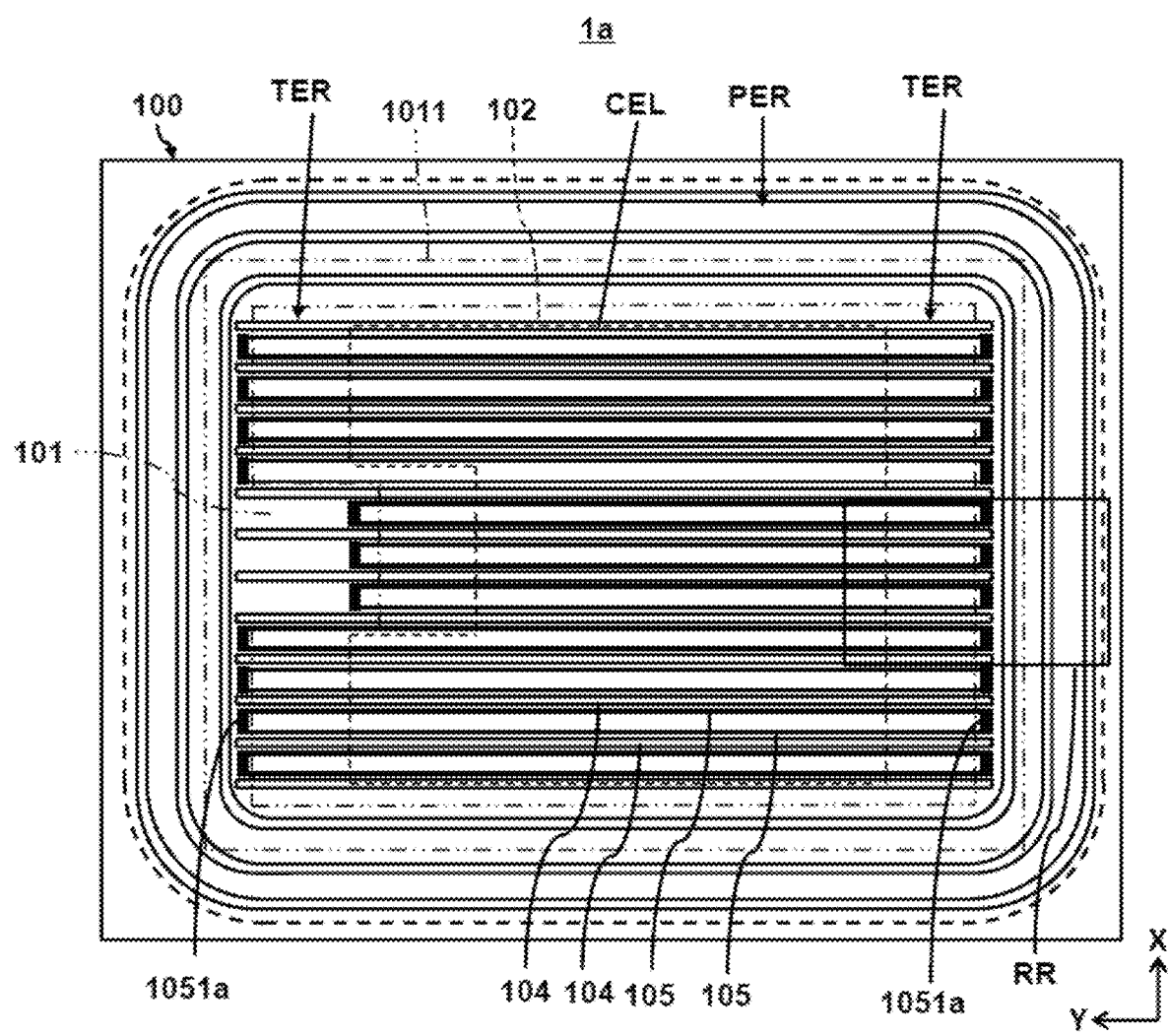
FIG. 22 is a plan view of a semiconductor device having a vertical type MOSFET structure according to the second embodiment.
Figure 23:
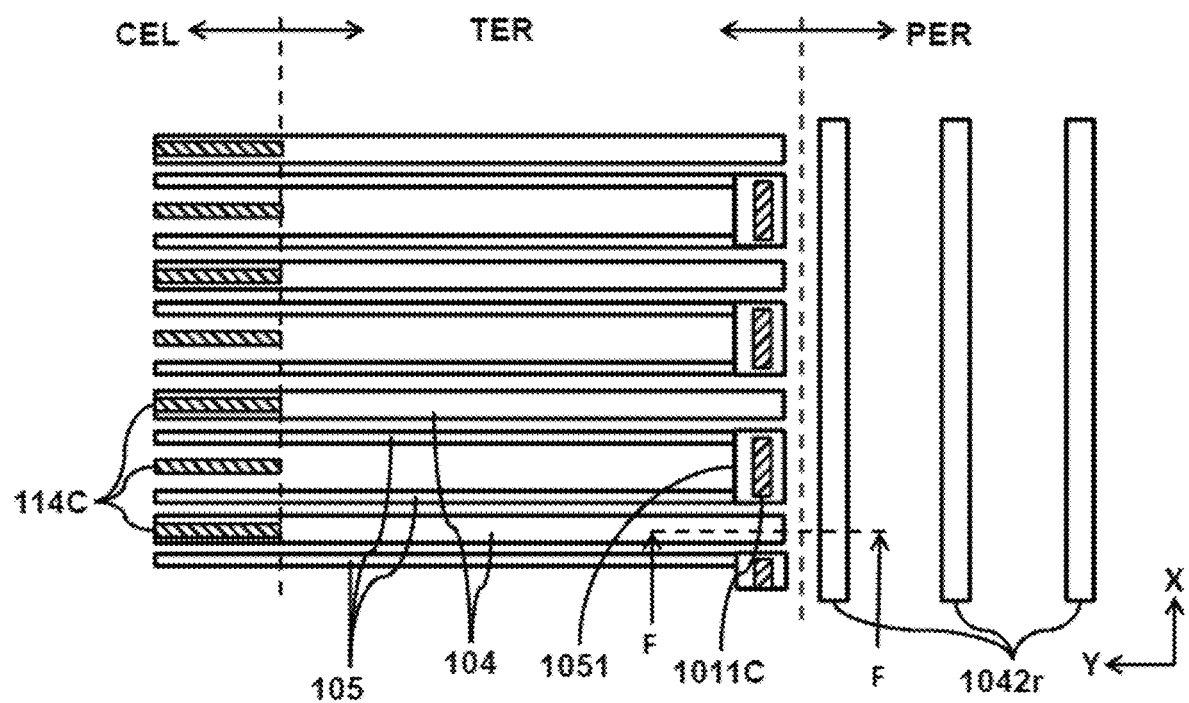
FIG. 23 is a plan view showing a rectangular region RR in FIG. 22 in an enlarged manner.
Figure 24:
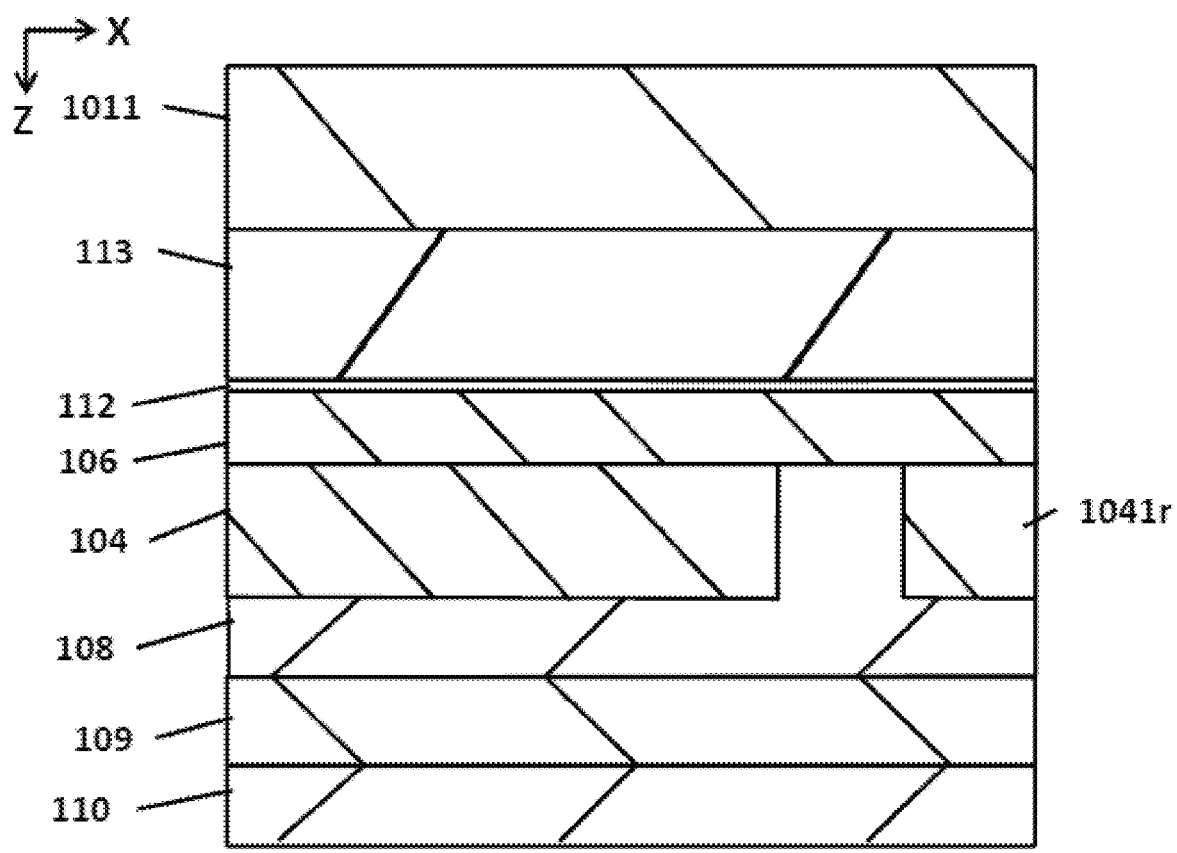
FIG. 24 is a cross-sectional view along a line F-F in FIG. 23.
Figure 25:
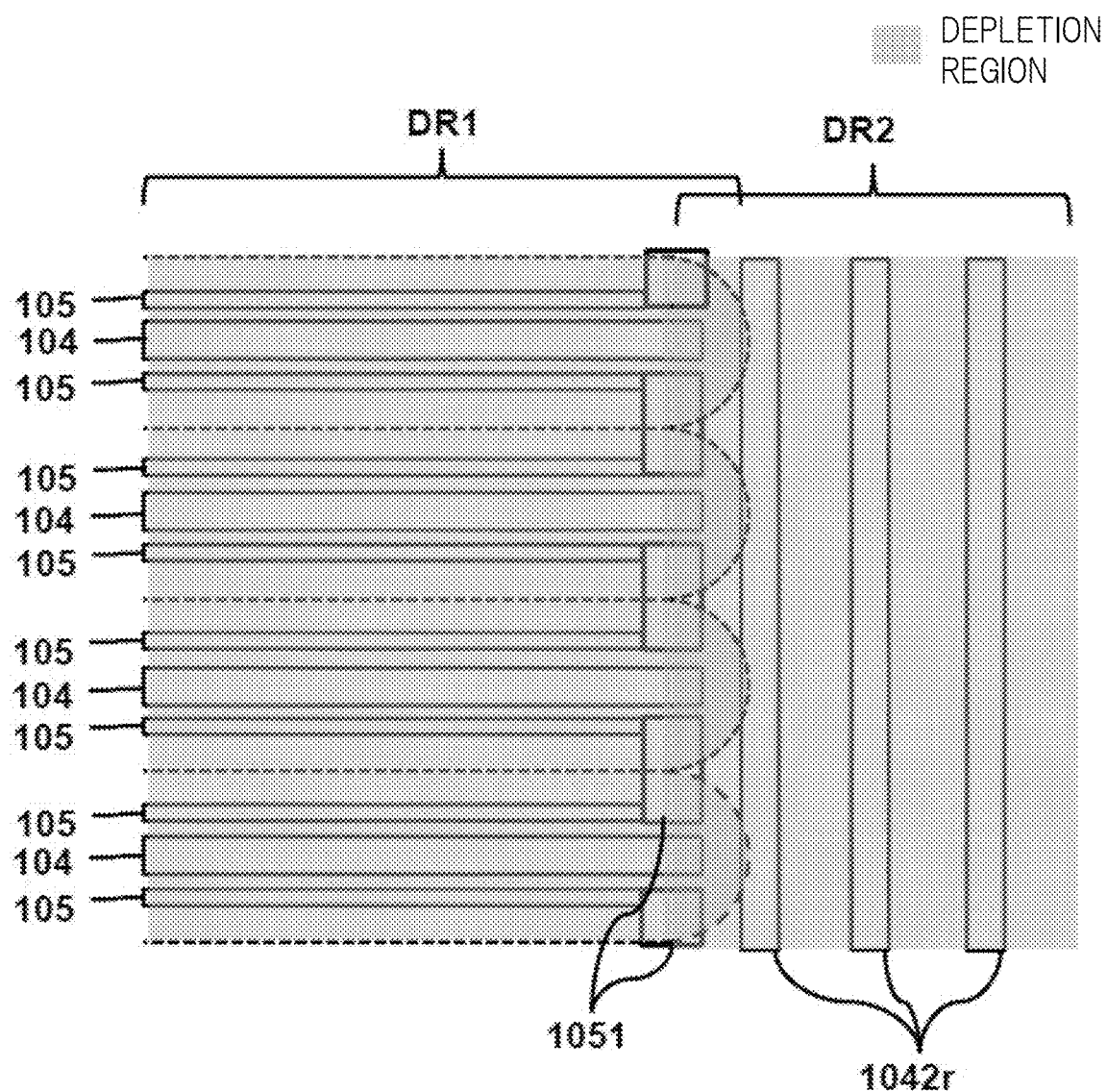
FIG. 25 is a plan view explaining a depletion region in FIG. 24.

FIG. 22 is a plan view of a semiconductor device having a vertical type MOSFET structure according to the second embodiment. FIG. 23 is a plan view showing a rectangular region RR in FIG. 22 in an enlarged manner. FIG. 24 is a cross-sectional view along a line F-F in FIG. 23. FIG. 25 is a plan view explaining the depletion region in FIG. 24.

In a semiconductor device 1*a* shown in FIG. 22, the three annular p type column regions 1041*r* are provided in the peripheral portion PER. As shown in FIG. 22 and FIG. 23, in the termination portion TER, the two trench gates 105 provided between the adjacent p type column regions 104 are connected to connection trench gates 1051*a*. Both ends of the two trench gates 105 provided between the two adjacent p type column regions 104 are connected to the connection trench gates 1051*a*. Then, each of the p type column regions 104 is arranged so as to extend from the cell portion CEL to the termination portion TER. The end portions of the p type column regions 104 extend to the regions sandwiching the connection trench gates 1051*a*. Namely, the side walls of each of the connection trench gates 1051*a* are arranged between the end portions of the two p type column regions 104 extending from the cell portion CEL. Consequently, it is possible to reduce the region that is not depleted or the region that is hardly depleted.

As shown in FIG. 24, the gate contact electrode 1011C is connected to each of the connection trench gates 1051*a*. As shown in FIG. 24, the p type column region 104 is arranged up to the vicinity of the p type column region 1041*r*.

In FIG. 25, the depletion region DR1 indicates the region (range) in which the depletion layer based on the stripe-shaped p type column regions 104 spreads. Also, the depletion region DR2 indicates the region in which the depletion layer based on the annular p type column regions 1042*r* spreads. As shown in FIG. 25, the depletion regions DR1 and DR2 overlap, so that the non-depleted regions NDR shown in FIG. 14 and FIG. 16 are reduced. In this example, the non-depleted region NDR does not occur. Consequently, the withstand voltage of the semiconductor device can be improved.

According to the second embodiment, the same effect as the first embodiment can be obtained.

Next, a modification of the cell portion, a manufacturing method of the semiconductor device, and the like will be described.

(Fifth Modification)

Figure 26:
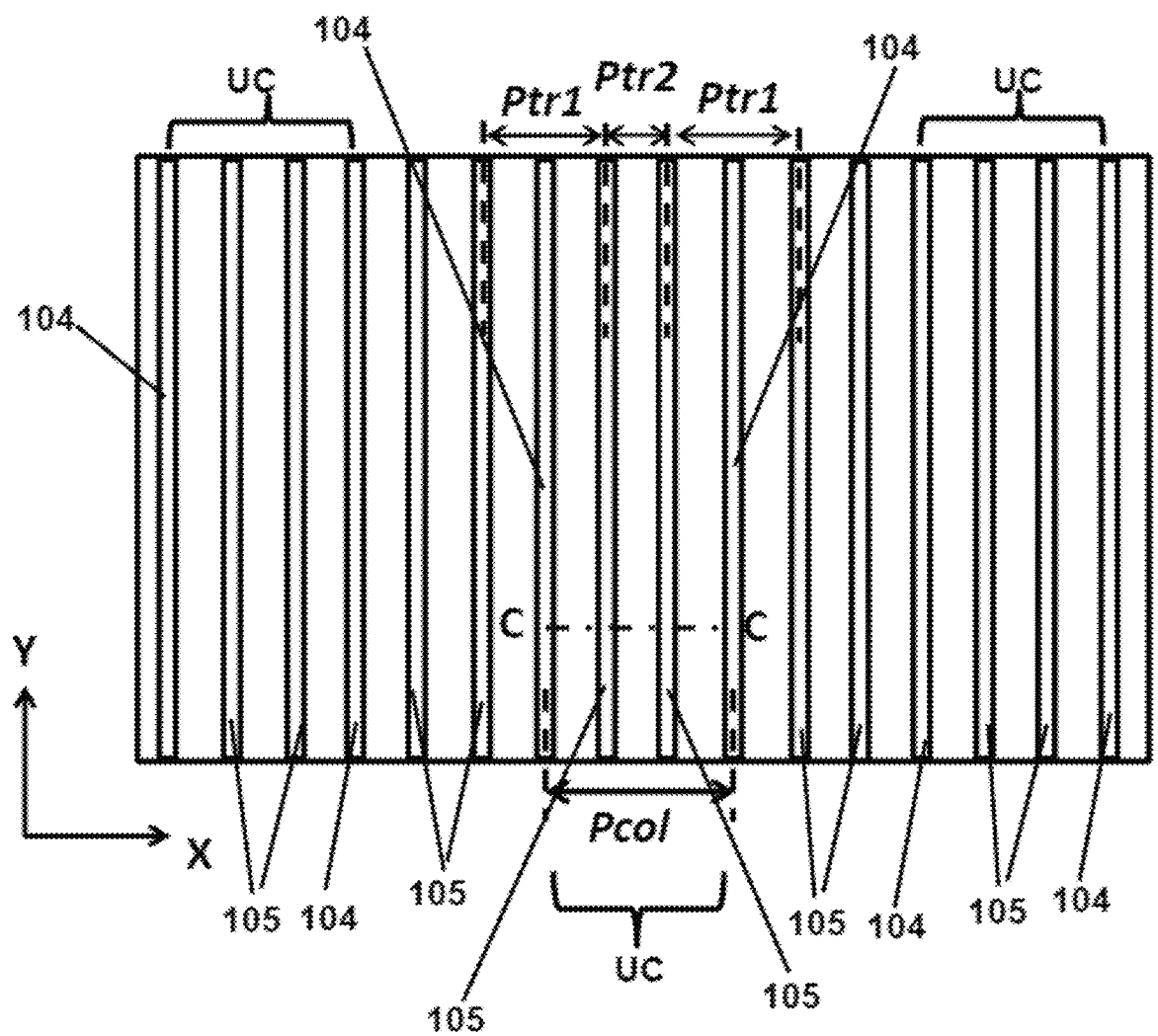
FIG. 26 is an enlarged plan view of a cell region of a semiconductor device according to the fifth modification.
Figure 27:
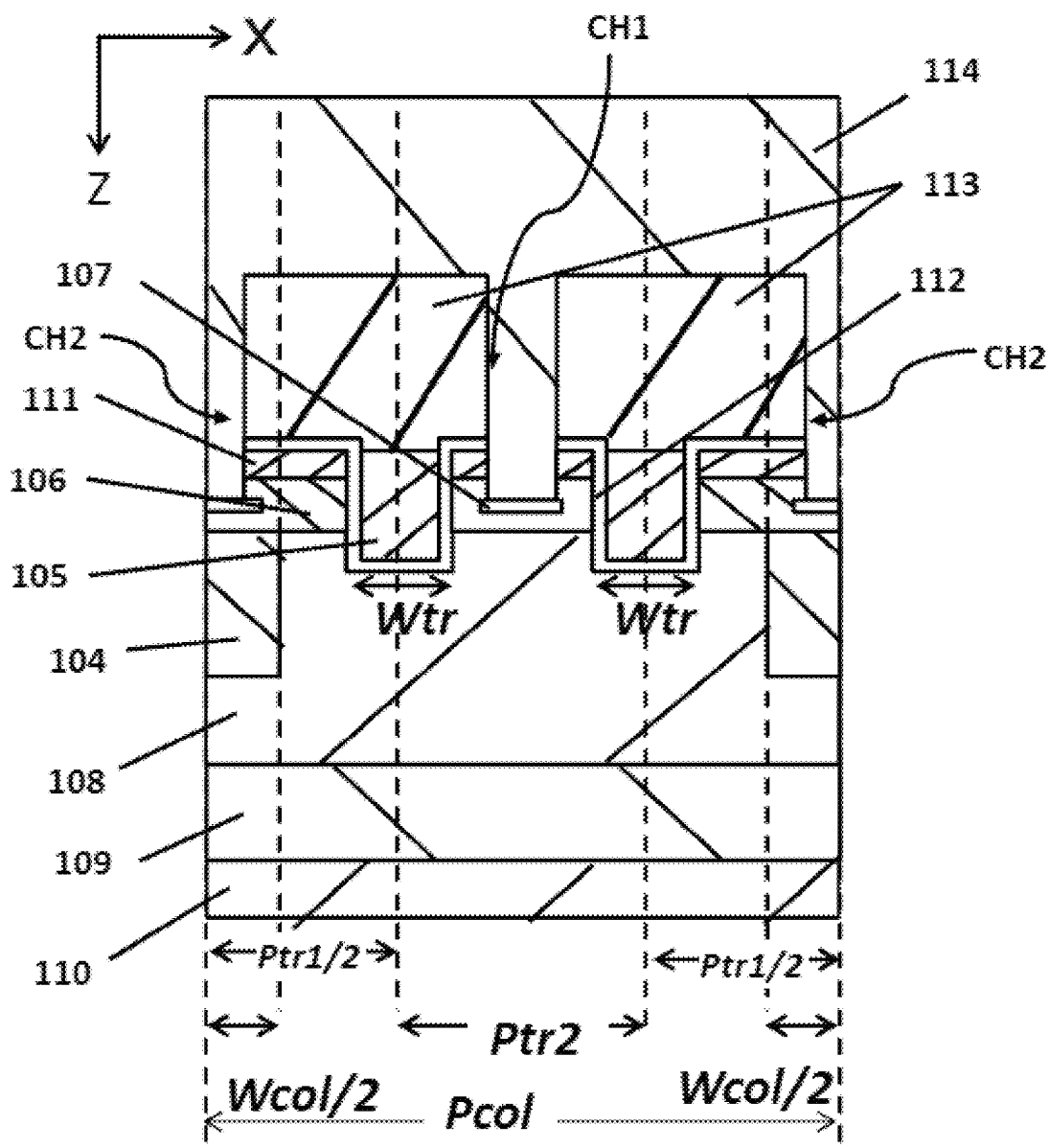
FIG. 27 is a cross-sectional view showing a principal part of a unit cell in FIG. 26.

The fifth modification is shown in FIG. 26 and FIG. 27. FIG. 26 is an enlarged plan view of a cell region showing the fifth modification of the semiconductor device having the vertical type MOSFET structure according to the embodiment. FIG. 27 is a cross-sectional view showing a principal part of the unit cell UC in FIG. 26.

As compared with the first embodiment, the modified point in the fifth modification is that, when the repetitive interval of the trench gates 105 is set to two kinds such as an interval Ptr1 and an interval Ptr2 and the repetitive interval of the p type column regions 104 is set to the interval Pcol, they have the relationship that the interval Pcol is the addition of the interval Ptrol and the interval Ptr2.

With this relationship, as compared with the first embodiment, the degree of freedom in the design of the unit cell is improved and the distance between the p type column region 104 and the trench gate 105 can be increased, so that the influence on the channel resistance by the p type column region 104 can be suppressed. Further, since the distance between the PN junction portion between the p type column region and the n type column region (n type drift region 108) and the trench gate 105 can be increased, the coupling of the field intensity that is increased in each of the PN junction portion and the lower part of the trench gate 105 can be suppressed, and thus the withstand voltage can be improved.

(Manufacturing Method)

Hereinafter, the manufacturing method of the vertical type MOSFET according to the first and second embodiments will be described.

Figure 28:
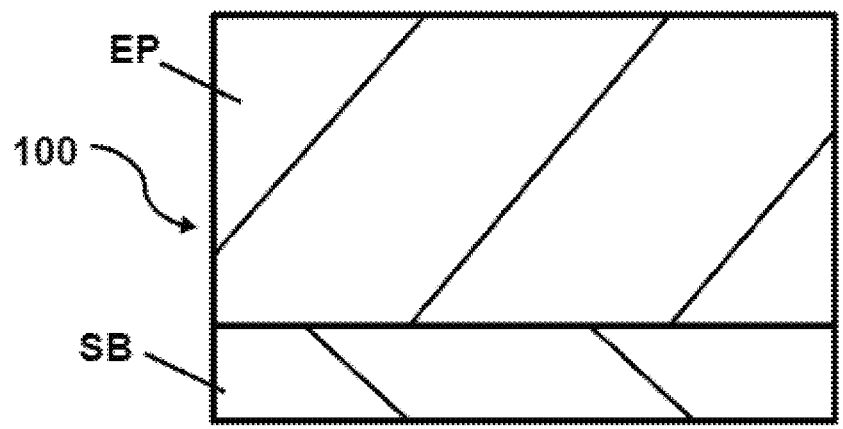
FIG. 28 is a cross-sectional view showing a principal part of a manufacturing process of the semiconductor device having the vertical type MOSFET structure according to the embodiment.

As shown in FIG. 28, the semiconductor substrate 100 having a crystal plane (100) and an epitaxial layer EP formed on a silicon substrate SB made of an n type high-concentration semiconductor layer is prepared.

Figure 29:
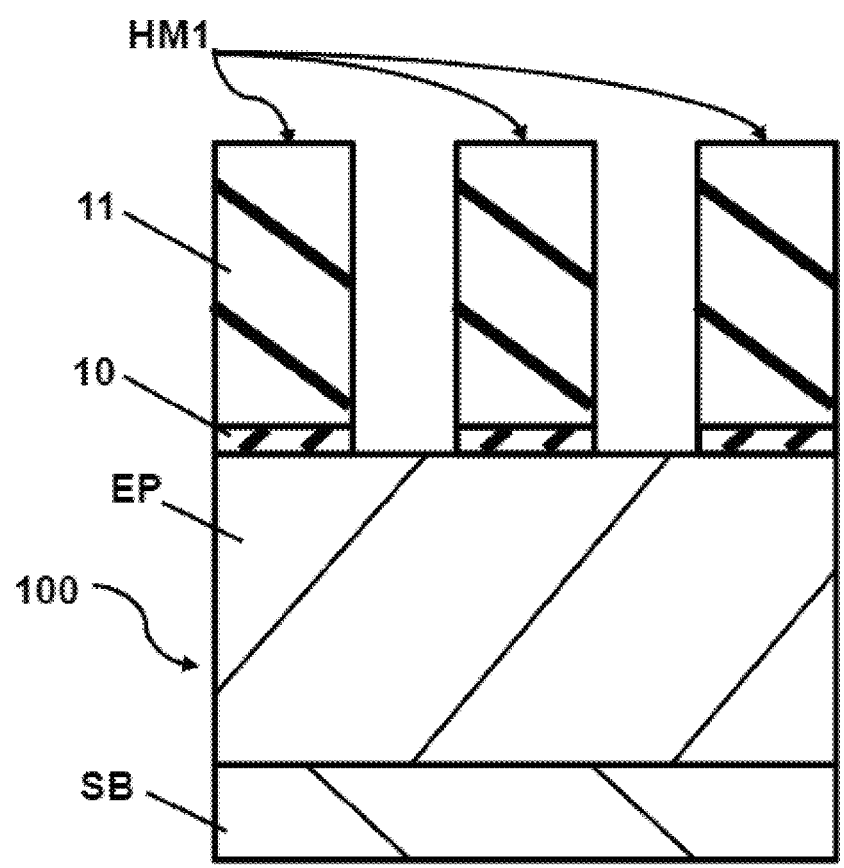
FIG. 29 is a cross-sectional view showing a principal part of the manufacturing process of the semiconductor device having the vertical type MOSFET structure continued from FIG. 28.

Next, as shown in FIG. 29, the insulating film 10 and a hard mask HM1 formed of a photoresist film 11 are formed on the upper surface of the epitaxial layer EP.

Figure 30:
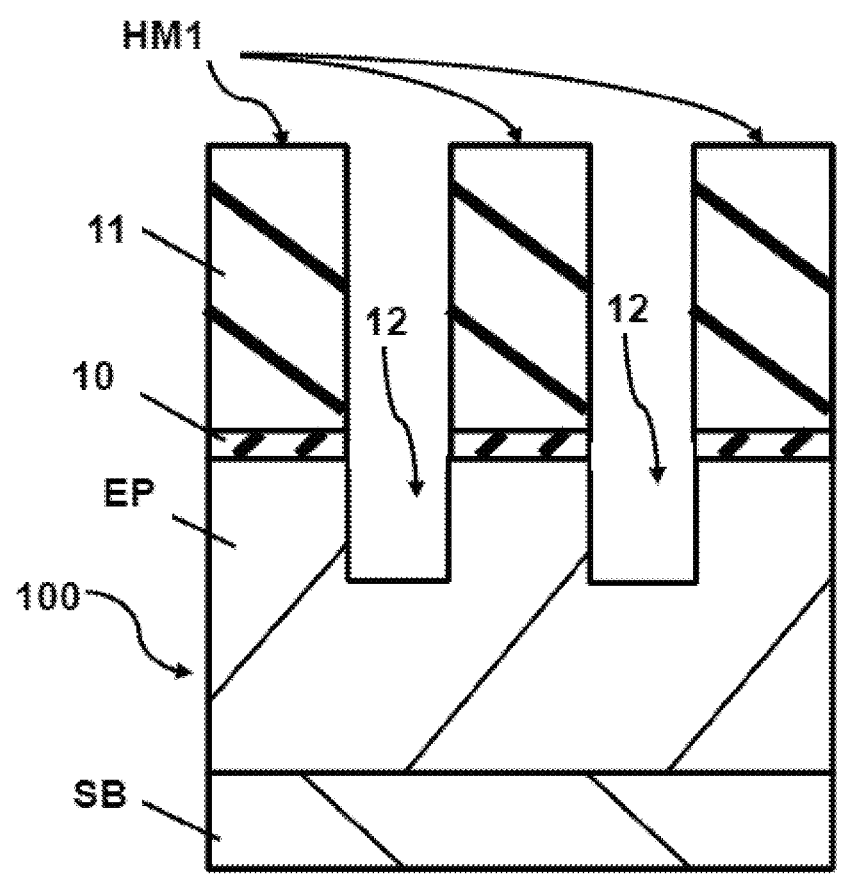
FIG. 30 is a cross-sectional view showing a principal part of the manufacturing process of the semiconductor device having the vertical type MOSFET structure continued from FIG. 29.

Next, as shown in FIG. 30, the upper surface of the epitaxial layer EP exposed from the hard mask HM1 is etched to form trenches 12 for the trench gate and the connection trench gate.

Figure 31:
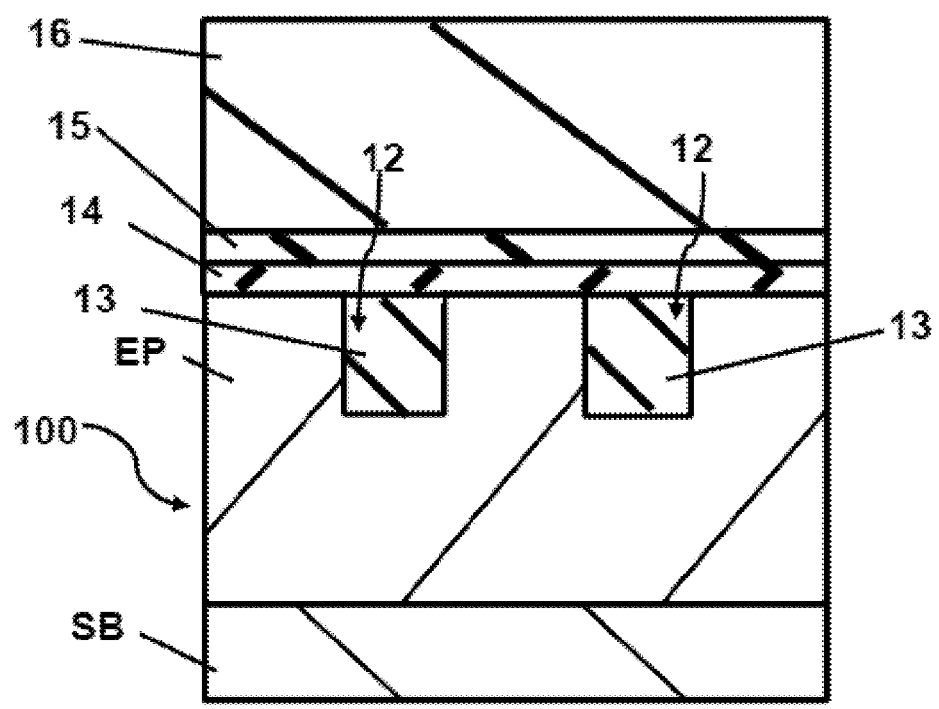
FIG. 31 is a cross-sectional view showing a principal part of the manufacturing process of the semiconductor device having the vertical type MOSFET structure continued from FIG. 30.

Next, after the hard mask HM1 is removed, as shown in FIG. 31, the trenches 12 are filled with an insulating film 13 and then the insulating film 14, the insulating film 15, and the insulating film 16 are sequentially formed on the upper surface of the epitaxial layer EP. For example, a silicon oxide film formed by the CVD method is used for each of the insulating film 14 and the insulating film 16. A silicon nitride film formed by the CVD method is used for the insulating film 15.

Figure 32:
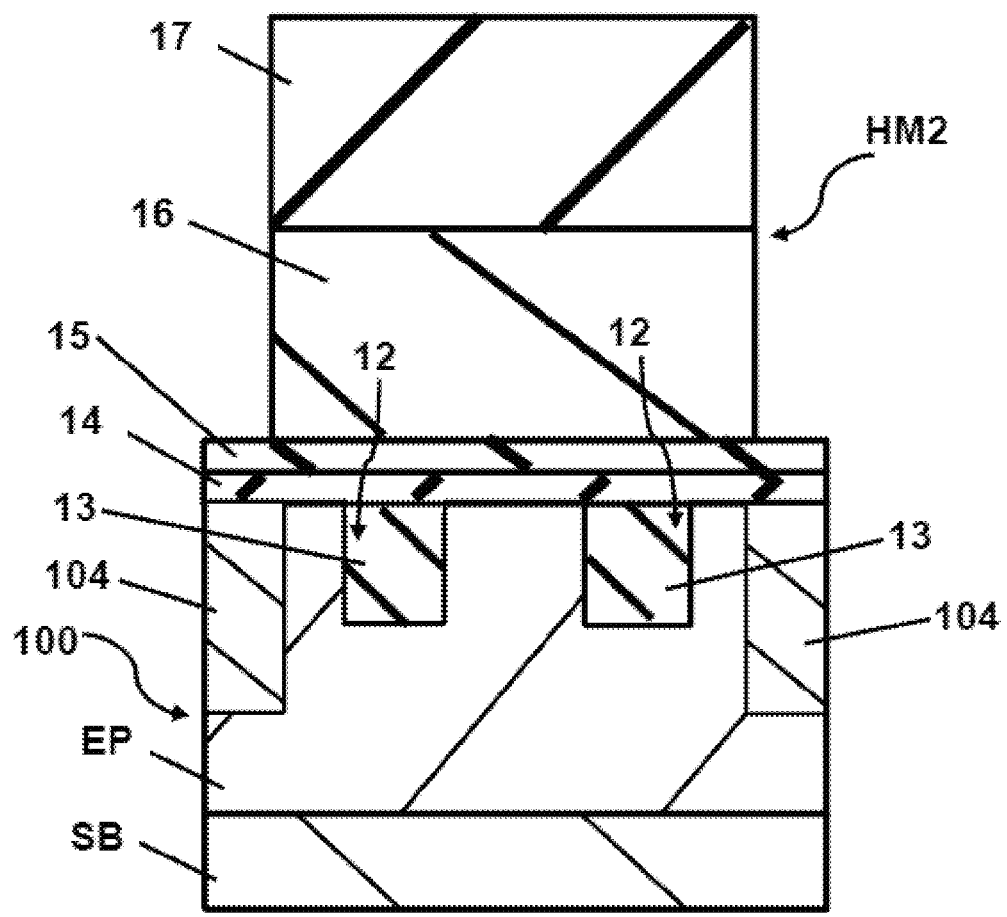
FIG. 32 is a cross-sectional view showing a principal part of the manufacturing process of the semiconductor device having the vertical type MOSFET structure continued from FIG. 31.

Next, as shown in FIG. 32, a hard mask HM2 formed of a photoresist film 17 and the insulating film 16 is formed by the normal photolithography and etching technologies. Next, a p type impurity such as boron is ion-implanted into the epitaxial layer EP with using the hard mask HM2 as an impurity implantation mask, thereby forming the p type column regions 104, 1041, 1041b, 1041c, 1042, and 1042r.

Figure 33:
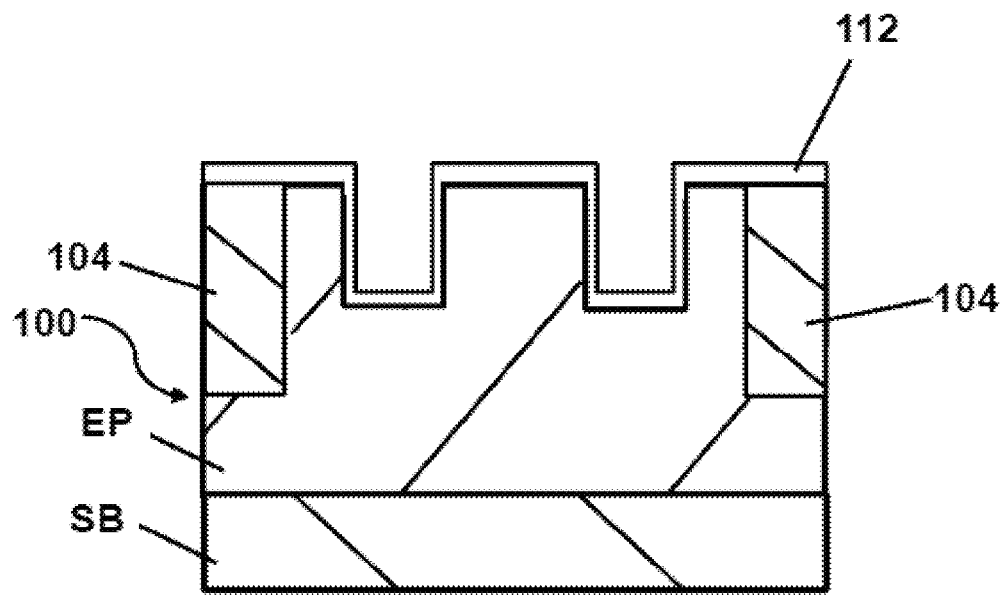
FIG. 33 is a cross-sectional view showing a principal part of the manufacturing process of the semiconductor device having the vertical type MOSFET structure continued from FIG. 32.

Next, after removing the hard mask HM2, the insulating film 15, and the insulating film 14, as shown in FIG. 33, the gate insulating film 112 is formed on the surface of the epitaxial layer EP including the surfaces of the trenches 12 by, for example, the thermal oxidation process.

Figure 34:
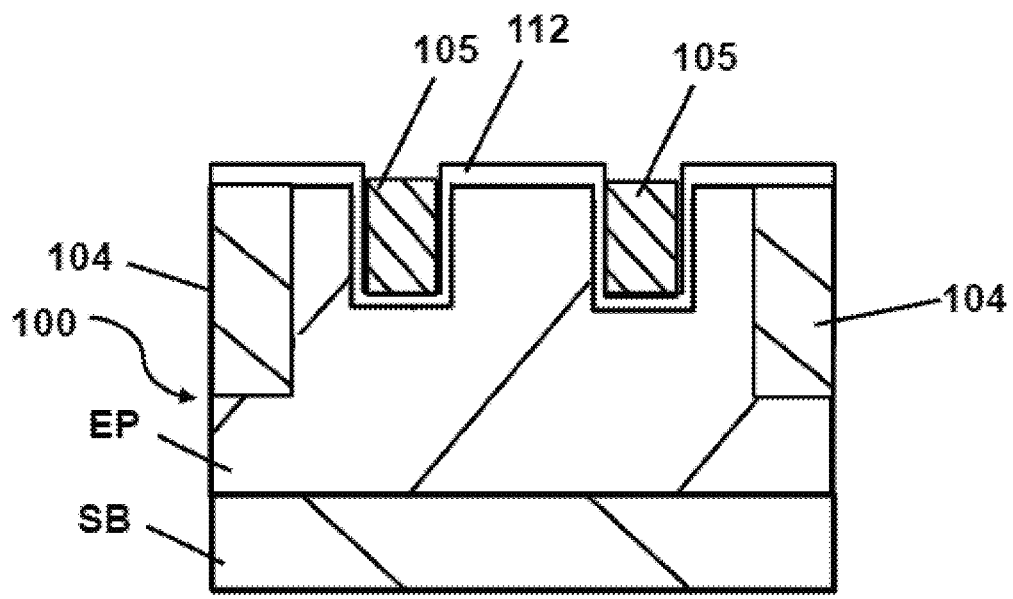
FIG. 34 is a cross-sectional view showing a principal part of the manufacturing process of the semiconductor device having the vertical type MOSFET structure continued from FIG. 33.

Next, as shown in FIG. 34, the trench gates 105 and the connection trench gate 1051 or 1051a are formed so as to fill the trenches 12. The trench gates 105 and the connection trench gate 1051 or 1051a are formed of, for example, a polycrystalline silicon film doped with an n type impurity and are selectively formed in the trenches 12 by depositing a polycrystalline silicon film on the entire surface of the semiconductor substrate 100 and then etching back the polycrystalline silicon film by the CMP method.

Figure 35:
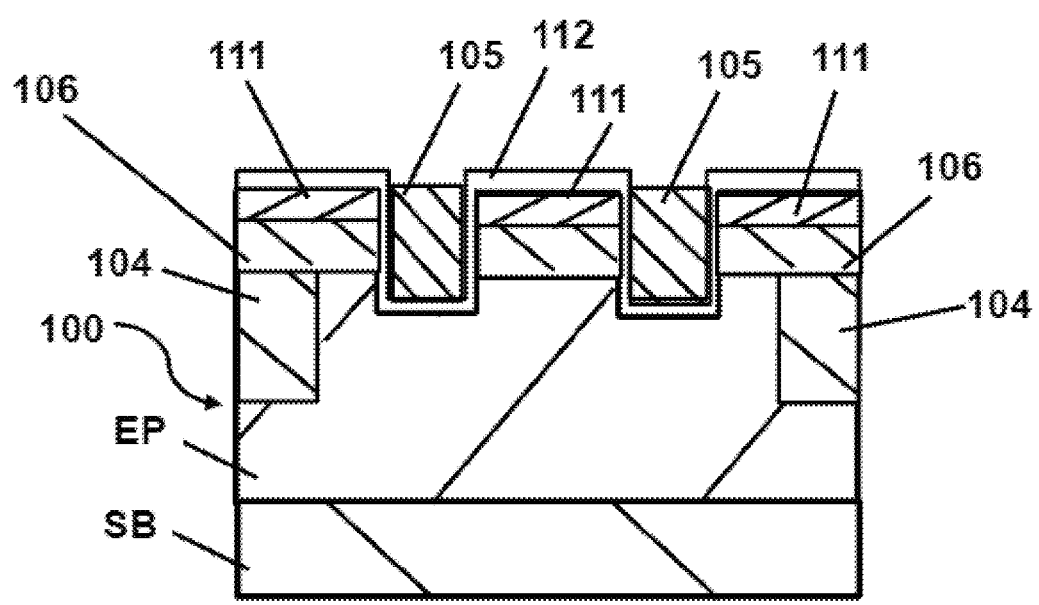
FIG. 35 is a cross-sectional view showing a principal part of the manufacturing process of the semiconductor device having the vertical type MOSFET structure continued from FIG. 34.

Next, as shown in FIG. 35, a p type impurity such as boron is selectively ion-implanted into the epitaxial layer EP, thereby forming the p type base region 106. The p type base region 106 is formed between the adjacent trench gates 105, is formed so as to be connected to the p type column region 104, and is formed at the position shallower than the bottom surface portion of the trench gate 105. Also, the p type base region 106 is formed so as to be connected to the p type column regions 1041, 1041b, 1041c, 1042, and 1042r.

Figure 36:
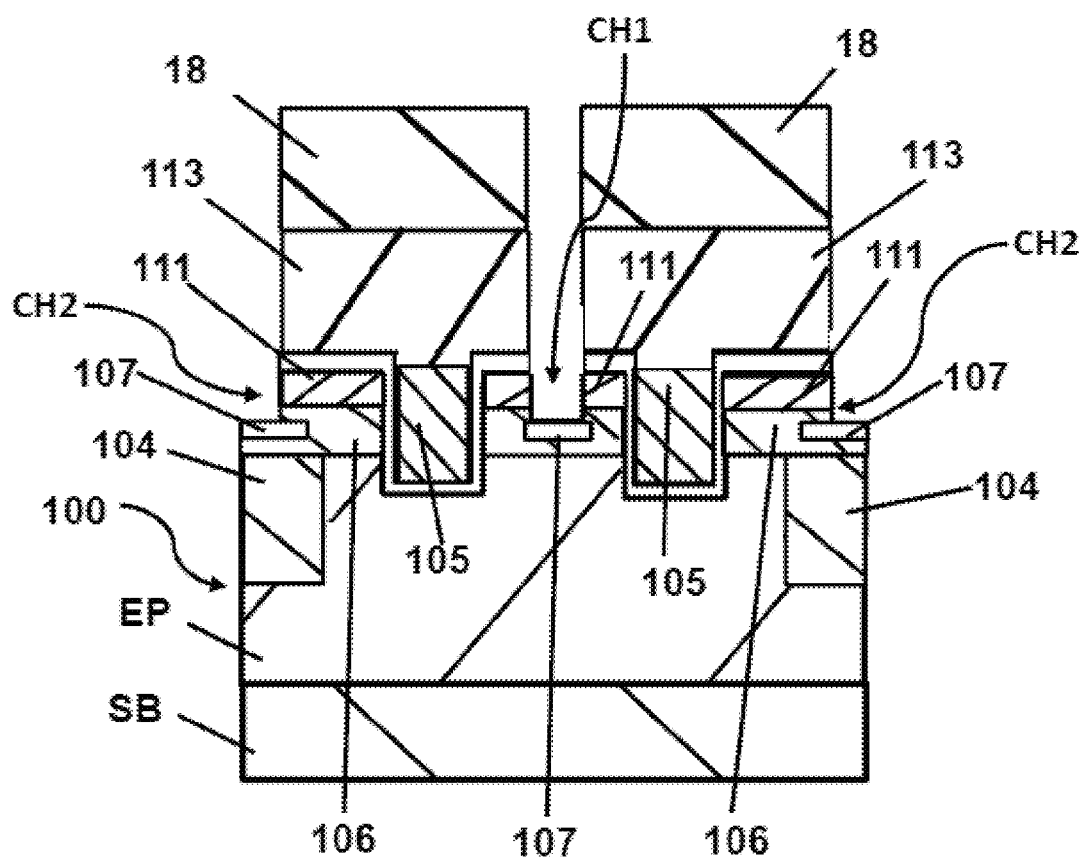
FIG. 36 is a cross-sectional view showing a principal part of the manufacturing process of the semiconductor device having the vertical type MOSFET structure continued from FIG. 35.

Next, as shown in FIG. 36, an n type impurity such as arsenic is selectively ion-implanted into the epitaxial layer EP, thereby forming the n type source region 111. The n type source region 111 is formed on the surface of the base region 106 and is formed so as to be located at the end portion of the trench gate 105.

Next, after the insulating film 113 is formed on the entire surface of the semiconductor substrate 100, the insulating film 113 is patterned by the normal photolithography and etching technologies using a photoresist film 18, thereby forming the contact holes CH1 and CH2 in the insulating film 113. The contact holes CH1 and CH2 are formed so as to be located between the adjacent trench gates 105 and on the p type column region 104, respectively. Also, the surface of the epitaxial layer EP is partially etched such that the bottom surfaces of the contact holes CH1 and CH2 reach the p type base region 106.

Next, the base contact regions 107 are formed in the p type base region 106 exposed from the contact holes CH1 and CH2 by the ion implantation of a p type impurity using the photoresist film 18 and the insulating film 113 as a mask.

Figure 37:
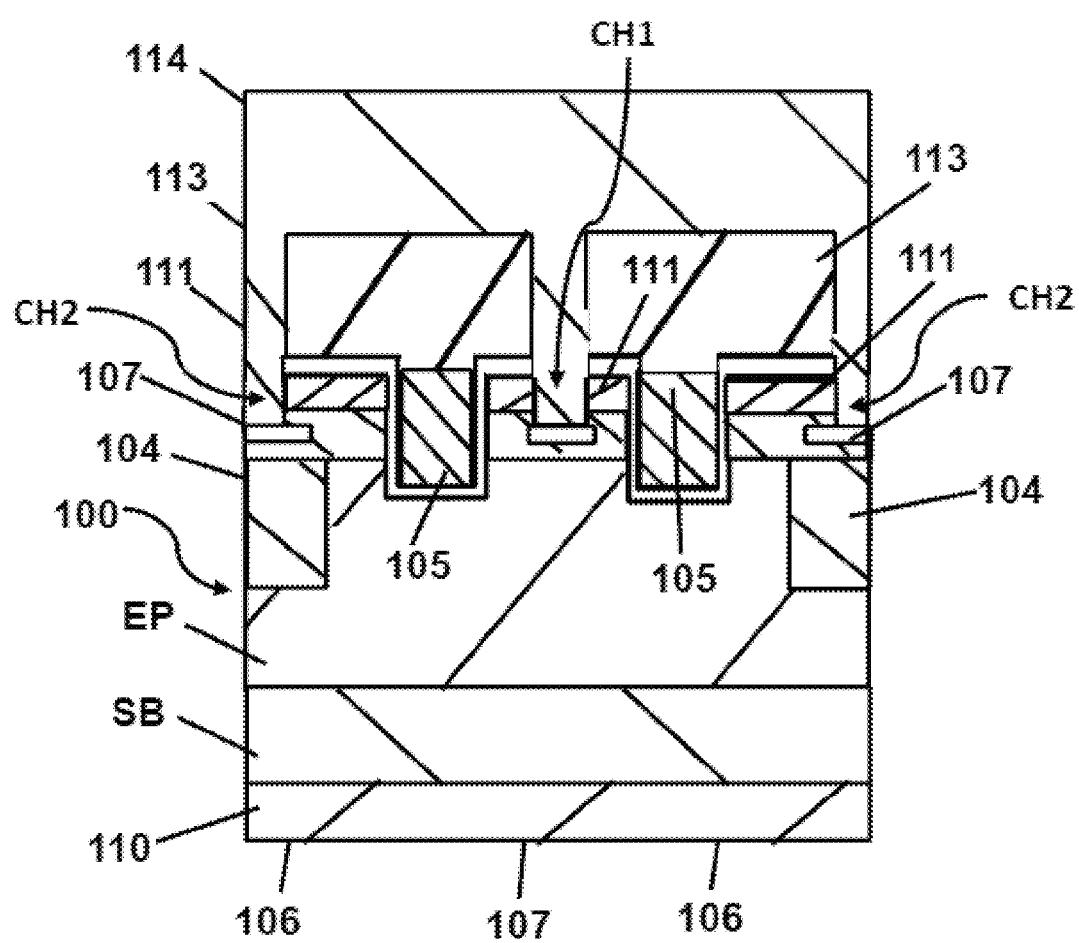
FIG. 37 is a cross-sectional view showing a principal part of the manufacturing process of the semiconductor device having the vertical type MOSFET structure continued from FIG. 36.

Next, after the photoresist film 18 is removed, as shown in FIG. 37, the source electrode 114 mainly made of, for example, aluminum is formed, and the drain electrode 110 having a stacked structure made of, for example, Au/Cu/Ni is formed on the lower surface of the semiconductor substrate 100, thereby completing the vertical type MOSFET.

In the foregoing, the invention made by the inventors of the present invention has been specifically described based on the embodiments. However, the present invention is not limited to the above-described embodiments, and various modifications are possible within the range not departing from the gist thereof.

For example, an embodiment of the n channel vertical type MOSFET has been described as the present invention, but the present invention can also be applied to the p channel vertical type MOSFET. In such a case, the semiconductor layers constituting the source region, the drain region, the base region (referred to also as channel formation region), and the drain region are configured to have the reverse conductivity type.

Also, the stripe-shaped p type column regions 104 described in the first and second embodiments may be arranged to be scattered in the n type drift region in zigzag pattern or in mesh pattern in plan view as shown in FIGS. 38 to 41.

Figure 38:
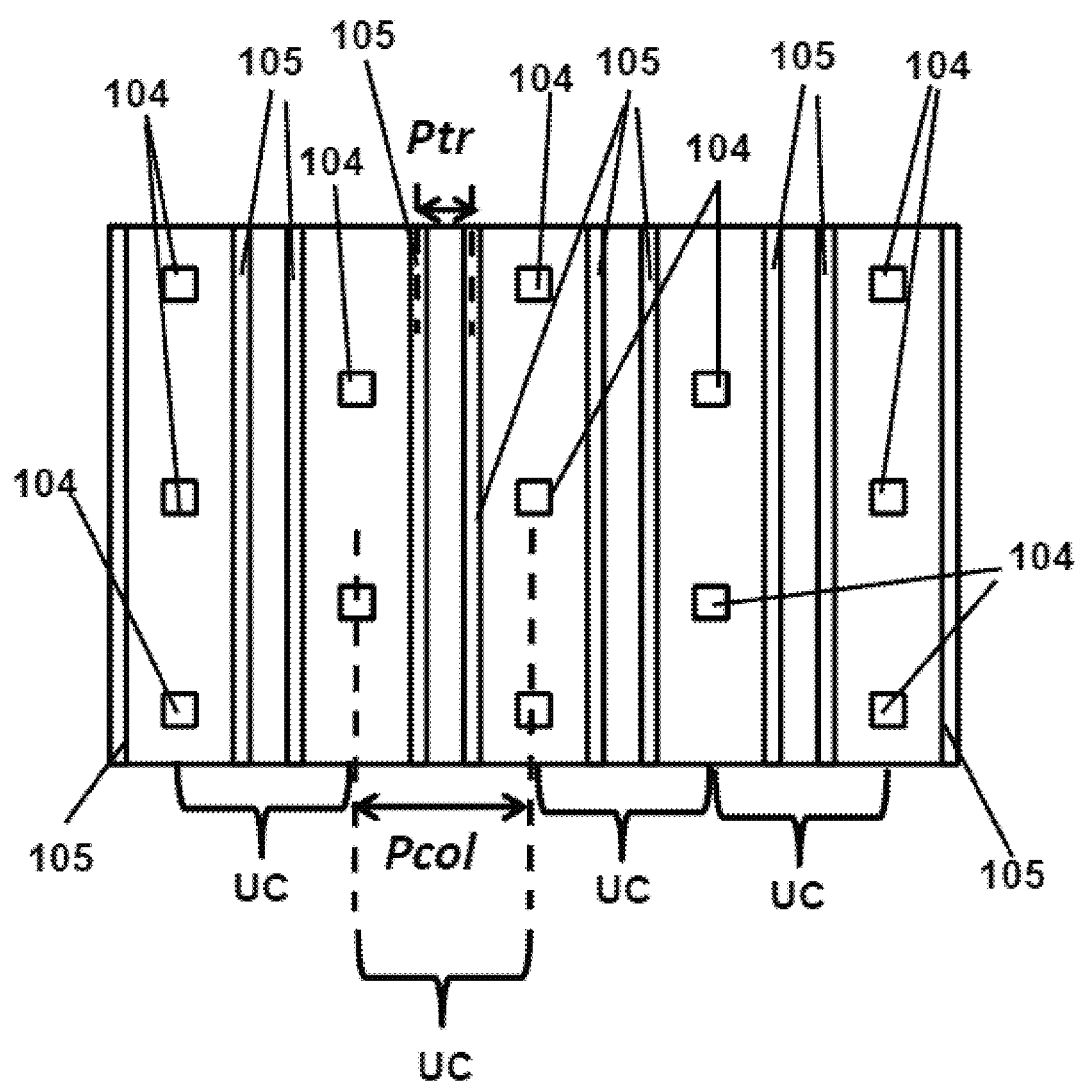
FIG. 38 is an enlarged plan view of a cell region of a semiconductor device having a vertical type MOSFET structure according to the sixth modification of the embodiment.
Figure 39:
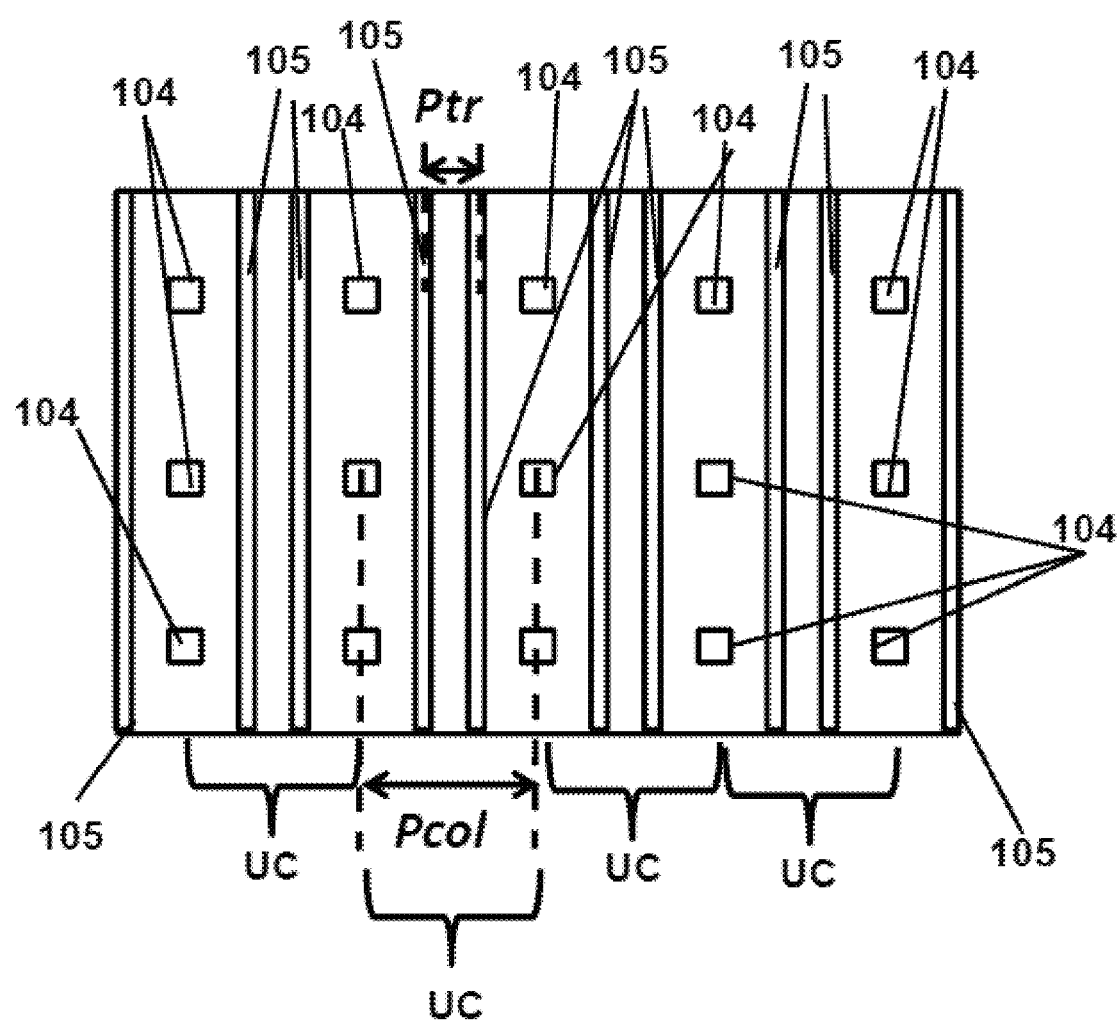
FIG. 39 is an enlarged plan view of a cell region of a semiconductor device having a vertical type MOSFET structure according to the seventh modification of the embodiment.
Figure 40:
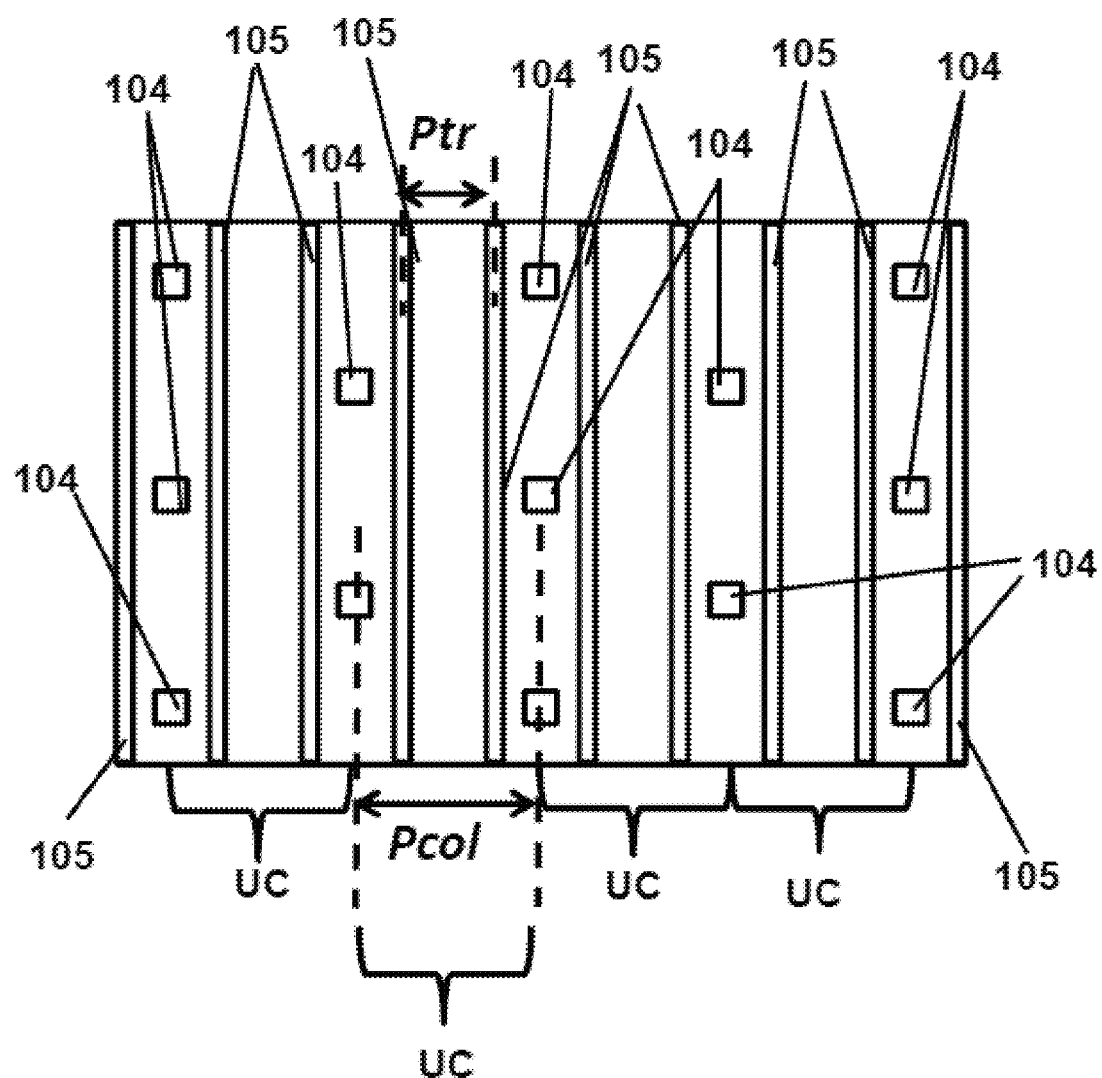
FIG. 40 is an enlarged plan view of a cell region of a semiconductor device having a vertical type MOSFET structure according to the eighth modification of the embodiment.
Figure 41:
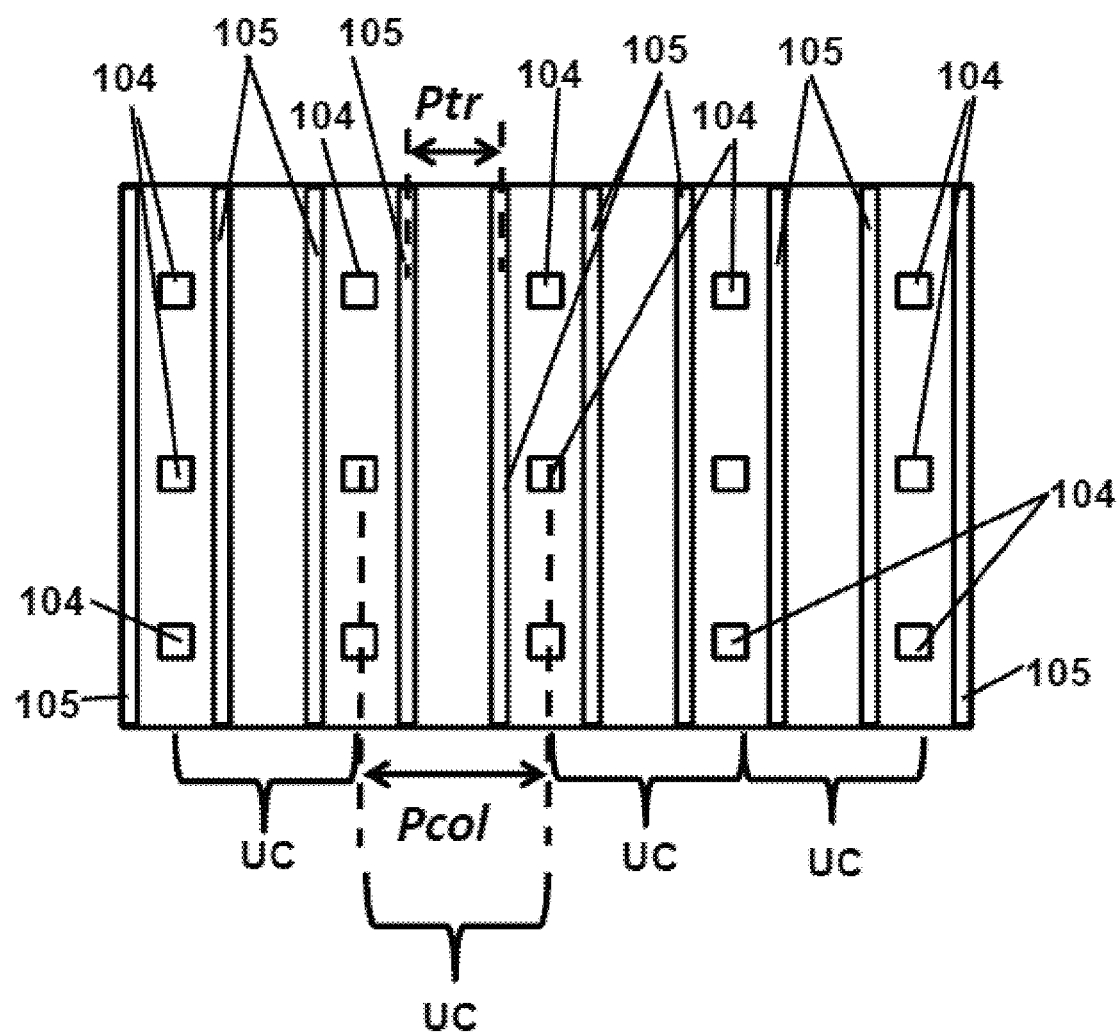
FIG. 41 is an enlarged plan view of a cell region of a semiconductor device having a vertical type MOSFET structure according to the ninth modification of the embodiment.

In this case, as shown in FIGS. 38 to 41, the occupancy of the p type column region 104 in plan view is the lowest in the case of the zigzag pattern shown in FIGS. 38 and 40 and the current path has the large width, and thus the effect of the on-resistance reduction is large. Further, also in the case of the rectangular mesh pattern shown in FIGS. 39 and 41, the current path has the larger width than that of the stripe-shaped p type column regions 104 described in the first and second embodiments, and thus the effect of the on-resistance reduction is large.

On the other hand, as to the easiness of the depletion necessary for obtaining the high withstand voltage, it is more preferable that the distance between the p type column regions becomes shorter and the relationship of the PN junction formed by the p type column region and the n type column region (n type drift region) becomes more uniform. Therefore, the withstand voltage can be suitably increased in the order of the stripe pattern, the rectangular mesh pattern, and the zigzag pattern contrary to the easiness of the on-resistance reduction.

When the p type column regions 104 are arranged to be scattered in dot pattern such as the zigzag pattern and the mesh pattern in the cell portion CEL in plan view as shown in FIGS. 38 to 41, the interval (pitch) between the p type column regions 104 is made larger than the interval (pitch) between the p type column regions 104 arranged in dot pattern in the termination portion TER in FIG. 9.

Figure 42:
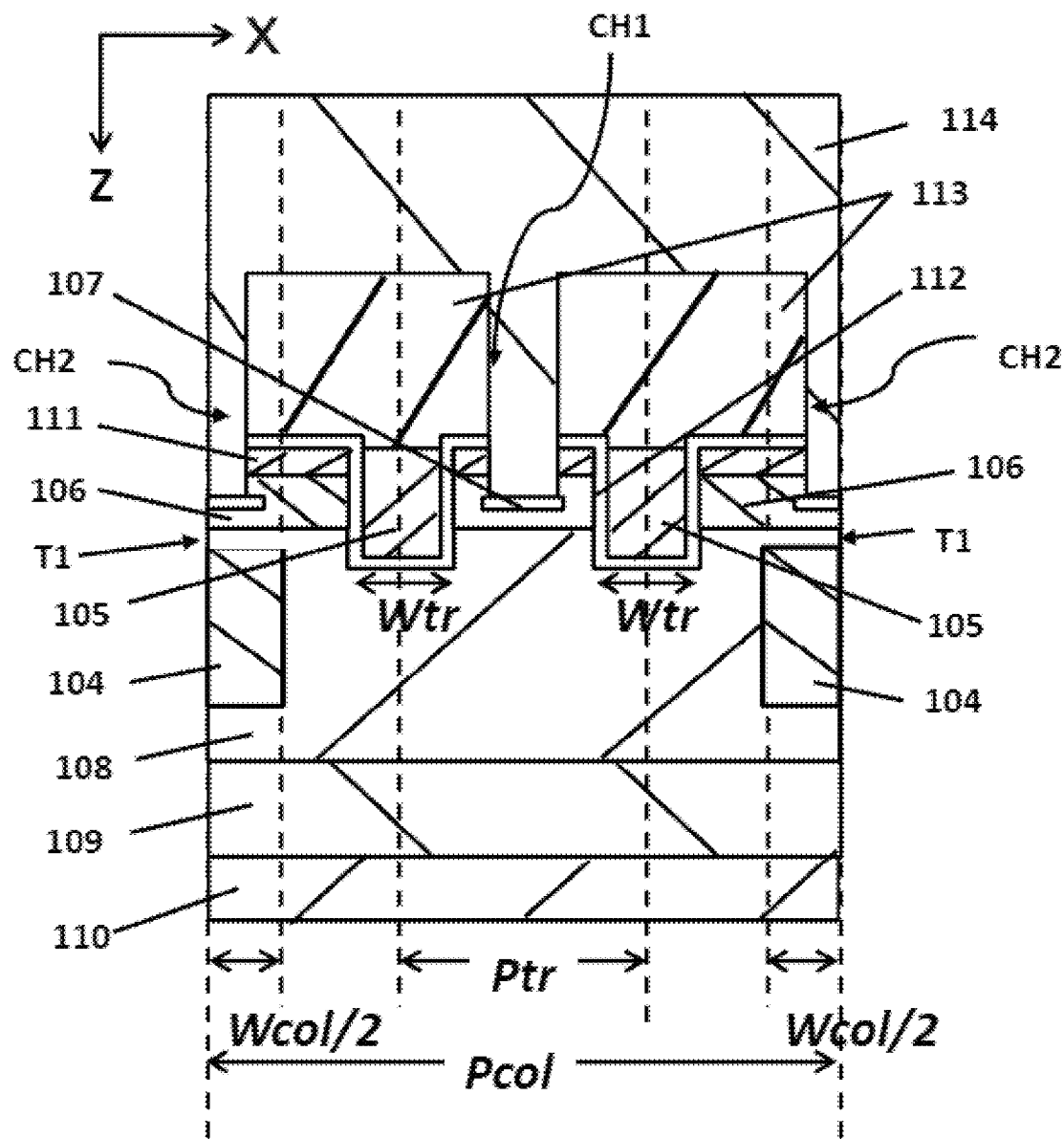
FIG. 42 is an enlarged plan view of a cell region of a semiconductor device having a vertical type MOSFET structure according to the tenth modification of the embodiment.

Further, as shown in FIG. 42, it is not always necessary to directly connect the p type column region 104 to the bottom surface of the p type base region 106. The p type column region 104 may be arranged so as to be separated from the bottom surface of the p type base region 106 by a predetermined interval (T1). Further, it is also not always necessary to directly connect the p type column regions 1041, 1041b, 1041c, 1042, and 1042r to the bottom surface of the p type base region 106. In this case, the p type column region 104 is in the state of being surrounded by the n type drift region 108 and the potential is in the floating state. However, this can be solved by suppressing the thickness (interval) T1 of the n type region between the p type base region 106 and the p type column region 104 to the thickness that forms the barrier through which the holes can be supplied from the p type base region 106 to the p type column region 104 at the time of actuation of the vertical type MOSFET. For example, a thickness of about 0.5 μm can be shown as a preferable value of the thickness T1 of the n type region between the p type column regions 104.

With this configuration, the distribution of the depletion layer can be more optimized than the structure shown in FIG. 3, and it is thus possible to contribute to the improvement in the withstand voltage of the vertical type MOSFET.

What is claimed is:

1. A semiconductor device comprising:
a cell portion in which a vertical type MOSFET is formed; and
a termination portion arranged adjacent to the cell portion, wherein the termination portion includes a connection trench gate provided along a first direction,
the cell portion includes:
a plurality of first column regions provided along a second direction intersecting the first direction; and
a plurality of trench gates provided along the second direction such that two trench gates are arranged between the two adjacent first column regions,
the plurality of trench gates extend from the cell portion to the termination portion and are connected to the connection trench gate,
the plurality of first column regions extend from the cell portion to the termination portion, and
the termination portion includes a plurality of second column regions different from the plurality of first column regions.

2. The semiconductor device according to claim 1, wherein the plurality of second column regions are arranged between end portions of the plurality of first column regions extending to the termination portion and the connection trench gate and between the plurality of trench gates in the termination portion.

3. The semiconductor device according to claim 2, wherein the plurality of second column regions are arranged in dot pattern,
the plurality of second column regions include a plurality of third column regions arranged most adjacent to the connection trench gate, and
a predetermined distance is provided between the plurality of third column regions and the connection trench gate.

4. The semiconductor device according to claim 3, wherein the plurality of second column regions include a plurality of fourth column regions arranged most adjacent to the cell portion, and
each of the plurality of fourth column regions is arranged between the end portions of the plurality of first column regions extending to the termination portion.

5. The semiconductor device according to claim 2, wherein the plurality of second column regions arranged between the end portions of the plurality of first column regions extending to the termination portion and the connection trench gate have a stripe shape, and
a width of each of the plurality of second column regions in the first direction is smaller than that of each of the plurality of first column regions in the first direction.

6. The semiconductor device according to claim 5, wherein the plurality of second column regions arranged between the plurality of trench gates in the termination portion are arranged in dot pattern.

7. The semiconductor device according to claim 5, wherein the plurality of second column regions arranged between the plurality of trench gates in the termination portion have a stripe shape, and
a width of each of the plurality of second column regions in the first direction is smaller than that of each of the plurality of first column regions in the first direction.

8. The semiconductor device according to claim 1 further comprising a peripheral portion arranged so as to surround the cell portion and the termination portion,
wherein the peripheral portion includes a plurality of fifth column regions, and
the plurality of fifth column regions are arranged in dot pattern or annular pattern.

9. The semiconductor device according to claim 1, wherein each of the plurality of trench gates and the connection trench gate includes a gate electrode formed in a trench,
the gate electrode of the plurality of trench gates and the gate electrode of the connection trench gate are connected to each other, and
a width of the connection trench gate in the second direction is larger than that of each of the plurality of trench gates in the first direction.

10. The semiconductor device according to claim 1 further comprising:
a semiconductor substrate including a drift region made of a semiconductor layer of a first conductivity type;
a base region which is formed on a surface of the drift region and is made of a semiconductor layer of a second conductivity type reverse to the first conductivity type;
the plurality of first column regions which are arranged under the base region and are made of the semiconductor layer of the second conductivity type arranged in the drift region at predetermined intervals;
a plurality of trenches which are arranged in the drift region between the plurality of adjacent first column regions and are formed such that bottom surfaces thereof reach a position deeper than the base region;
a plurality of gate electrodes which are formed so as to be buried in the plurality of trenches and are formed via a gate insulating film formed on surfaces of the trenches; and
a plurality of source regions which are formed in the base region and are made of a semiconductor layer of the first conductivity type formed on side portions of each of the plurality of gate electrodes.

11. The semiconductor device according to claim 10, wherein the plurality of first column regions and the plurality of gate electrodes are formed in stripe shape along the second direction in plan view.

12. The semiconductor device according to claim 10, wherein bottom surfaces of the plurality of first column regions and bottom surfaces of the plurality of second column regions are located in the drift region at a position deeper than the bottom surfaces of the plurality of trenches.

13. The semiconductor device according to claim 10, wherein the plurality of first column regions are not arranged between the adjacent gate electrodes of the plurality of gate electrodes in plan view.

14. The semiconductor device according to claim 10, wherein the plurality of first column regions and the plurality of second column regions are arranged so as to be connected to a bottom surface of the base region.

15. The semiconductor device according to claim 10, wherein the plurality of first column regions and the plurality of second column regions are arranged so as to be separated from a bottom surface of the base region by a predetermined interval in a thickness direction of the semiconductor substrate.

16. A semiconductor device comprising:

a cell portion in which a vertical type MOSFET is formed; and a termination portion arranged adjacent to the cell portion, wherein the termination portion includes a plurality of connection trench gates provided along a first direction, the cell portion includes:

a plurality of first column regions provided along a second direction intersecting the first direction; and a plurality of trench gates provided along the second direction such that two trench gates are arranged between the two adjacent first column regions, the plurality of trench gates extend from the cell portion to the termination portion and the two trench gates arranged between the two adjacent first column regions are connected to one connection trench gate, the plurality of first column regions extend from the cell portion to the termination portion, and the one connection trench gate is arranged between end portions of the two adjacent first column regions in the termination portion.

17. The semiconductor device according to claim 16, wherein each of the plurality of trench gates and the connection trench gates includes a gate electrode formed in a trench, the gate electrodes of the two trench gates and the gate electrode of the one connection trench gate are connected to one another, and a width of each of the plurality of connection trench gates in the second direction is larger than that of each of the plurality of trench gates in the first direction.

\* \* \* \* \*